United States Patent
Cronie et al.

(10) Patent No.: US 9,424,908 B2
(45) Date of Patent: Aug. 23, 2016

(54) DIFFERENTIAL VECTOR STORAGE FOR DYNAMIC RANDOM ACCESS MEMORY

(71) Applicant: KANDOU LABS, S.A., Lausanne (CH)

(72) Inventors: Harm Cronie, Echallens (CH); Amin Shokrollahi, Preverenges (CH)

(73) Assignee: KANDOU LABS, S.A. (CH)

( * ) Notice: Subject to any disclaimer, the term of this patent is extended or adjusted under 35 U.S.C. 154(b) by 0 days.

(21) Appl. No.: 15/057,533

(22) Filed: Mar. 1, 2016

(65) Prior Publication Data

US 2016/0180913 A1  Jun. 23, 2016

Related U.S. Application Data

(63) Continuation of application No. 13/843,785, filed on Mar. 15, 2013, now Pat. No. 9,275,720.

(60) Provisional application No. 61/697,515, filed on Sep. 6, 2012.

(51) Int. Cl.
*G11C 11/24* (2006.01)
*G11C 11/408* (2006.01)
*G11C 11/4096* (2006.01)

(52) U.S. Cl.
CPC ........ *G11C 11/4087* (2013.01); *G11C 11/4096* (2013.01)

(58) Field of Classification Search
CPC ...................................................... G11C 11/24
USPC ........................................................ 365/149
See application file for complete search history.

(56) References Cited

U.S. PATENT DOCUMENTS

| 3,196,351 | A | 7/1965 | Slepian |
| 3,636,463 | A | 1/1972 | Ongkiehong |

(Continued)

FOREIGN PATENT DOCUMENTS

| CN | 101478286 | 7/2009 |
| EP | 2039221 | 2/2013 |

(Continued)

OTHER PUBLICATIONS

Abbasfar, A., "Generalized Differentialyyyyyy Vector Signaling", IEEE International Conference on Communications, ICC '09, (Jun. 14, 2009), pp. 1-5.

(Continued)

*Primary Examiner* — Harry W Byrne
(74) *Attorney, Agent, or Firm* — Invention Mine LLC

(57) ABSTRACT

A storage device stores data in groups of memory cells using vectors corresponding to voltage code codewords, each codeword having k entries. Entries have values selected from a set of at least three entry values and $2^n$ distinct inputs can be encoded into k-entry codewords for some n>k. A vector storage element comprising k cells can store an k electrical quantities (voltage, current, etc.) corresponding to a codeword. The voltage code is such that, for at least one position of a vector, there are at least three vectors having distinct entry values at that position and, for at least a subset of the possible codewords, the sum of the entry values over the positions of each vector is constant from vector to vector in that subset. The storage device might be an integrated circuit device, a discrete memory device, or a device having embedded memory.

20 Claims, 24 Drawing Sheets

(56) References Cited

U.S. PATENT DOCUMENTS

| | | |
|---|---|---|
| 3,939,468 A | 2/1976 | Mastin |
| 4,163,258 A | 7/1979 | Ebihara |
| 4,181,967 A | 1/1980 | Nash |
| 4,206,316 A | 6/1980 | Burnsweig |
| 4,276,543 A | 6/1981 | Miller |
| 4,486,739 A | 12/1984 | Franaszek |
| 4,499,550 A | 2/1985 | Ray, III |
| 4,774,498 A | 9/1988 | Traa |
| 4,864,303 A | 9/1989 | Ofek |
| 4,897,657 A | 1/1990 | Brubaker |
| 4,974,211 A | 11/1990 | Corl |
| 5,053,974 A | 10/1991 | Penz |
| 5,166,956 A | 11/1992 | Baltus |
| 5,168,509 A | 12/1992 | Nakamura |
| 5,283,761 A * | 2/1994 | Gillingham .............. 365/189.07 |
| 5,287,305 A | 2/1994 | Yoshida |
| 5,412,689 A | 5/1995 | Chan |
| 5,449,895 A | 9/1995 | Hecht |
| 5,459,465 A | 10/1995 | Kagey |
| 5,511,119 A | 4/1996 | Lechleider |
| 5,553,097 A | 9/1996 | Dagher |
| 5,599,550 A | 2/1997 | Kohlruss |
| 5,659,353 A | 8/1997 | Kostreski |
| 5,802,356 A | 9/1998 | Gaskins |
| 5,825,808 A | 10/1998 | Hershey |
| 5,875,202 A | 2/1999 | Venters |
| 5,945,935 A | 8/1999 | Kusumoto |
| 5,995,016 A | 11/1999 | Perino |
| 5,999,016 A | 12/1999 | McClintock |
| 6,005,895 A | 12/1999 | Perino |
| 6,084,883 A | 7/2000 | Norrell |
| 6,119,263 A | 9/2000 | Mowbray |
| 6,172,634 B1 | 1/2001 | Leonowich |
| 6,175,230 B1 | 1/2001 | Hamblin |
| 6,232,908 B1 | 5/2001 | Nakaigawa |
| 6,278,740 B1 | 8/2001 | Nordyke |
| 6,346,907 B1 | 2/2002 | Dacy |
| 6,359,931 B1 | 3/2002 | Perino |
| 6,404,820 B1 | 6/2002 | Postol |
| 6,417,737 B1 | 7/2002 | Moloudi |
| 6,452,420 B1 | 9/2002 | Wong |
| 6,483,828 B1 | 11/2002 | Balachandran |
| 6,504,875 B2 | 1/2003 | Perino |
| 6,509,773 B2 | 1/2003 | Buchwald |
| 6,556,628 B1 | 4/2003 | Poulton |
| 6,563,382 B1 | 5/2003 | Yang |
| 6,621,427 B2 | 9/2003 | Greenstreet |
| 6,624,699 B2 | 9/2003 | Yin |
| 6,650,638 B1 | 11/2003 | Walker |
| 6,661,355 B2 | 12/2003 | Cornelius |
| 6,686,879 B2 | 2/2004 | Shattil |
| 6,766,342 B2 | 7/2004 | Kechriotis |
| 6,839,429 B1 | 1/2005 | Gaikwad |
| 6,839,587 B2 | 1/2005 | Yonce |
| 6,854,030 B2 | 2/2005 | Perino |
| 6,865,234 B1 | 3/2005 | Agazzi |
| 6,865,236 B1 | 3/2005 | Terry |
| 6,898,724 B2 | 5/2005 | Chang |
| 6,927,709 B2 | 8/2005 | Kiehl |
| 6,954,492 B1 | 10/2005 | Williams |
| 6,963,622 B2 | 11/2005 | Eroz |
| 6,973,613 B2 | 12/2005 | Cypher |
| 6,976,194 B2 | 12/2005 | Cypher |
| 6,982,954 B2 | 1/2006 | Dhong |
| 6,990,138 B2 | 1/2006 | Bejjani |
| 6,999,516 B1 | 2/2006 | Rajan |
| 7,023,817 B2 | 4/2006 | Kuffner |
| 7,053,802 B2 | 5/2006 | Cornelius |
| 7,075,996 B2 | 7/2006 | Simon |
| 7,085,153 B2 | 8/2006 | Ferrant |
| 7,085,336 B2 | 8/2006 | Lee |
| 7,130,944 B2 | 10/2006 | Perino |
| 7,142,612 B2 | 11/2006 | Horowitz |
| 7,142,865 B2 | 11/2006 | Tsai |
| 7,164,631 B2 | 1/2007 | Tateishi |
| 7,167,019 B2 | 1/2007 | Broyde |
| 7,180,949 B2 | 2/2007 | Kleveland |
| 7,184,483 B2 | 2/2007 | Rajan |
| 7,269,212 B1 | 9/2007 | Chau |
| 7,335,976 B2 | 2/2008 | Chen |
| 7,339,990 B2 | 3/2008 | Hidaka |
| 7,348,989 B2 | 3/2008 | Stevens |
| 7,349,484 B2 | 3/2008 | Stojanovic |
| 7,356,213 B1 | 4/2008 | Cunningham |
| 7,358,869 B1 | 4/2008 | Chiarulli |
| 7,362,130 B2 | 4/2008 | Broyde |
| 7,370,264 B2 | 5/2008 | Worley |
| 7,389,333 B2 | 6/2008 | Moore |
| 7,428,273 B2 | 9/2008 | Foster |
| 7,456,778 B2 | 11/2008 | Werner |
| 7,462,956 B2 | 12/2008 | Lan |
| 7,496,162 B2 | 2/2009 | Srebranig |
| 7,535,957 B2 | 5/2009 | Ozawa |
| 7,570,704 B2 | 8/2009 | Nagarajan |
| 7,599,390 B2 | 10/2009 | Pamarti |
| 7,616,075 B2 | 11/2009 | Kushiyama |
| 7,633,850 B2 | 12/2009 | Ahn |
| 7,639,596 B2 | 12/2009 | Cioffi |
| 7,643,588 B2 | 1/2010 | Visalli |
| 7,656,321 B2 | 2/2010 | Wang |
| 7,694,204 B2 | 4/2010 | Schmidt |
| 7,697,915 B2 | 4/2010 | Behzad |
| 7,706,456 B2 | 4/2010 | Laroia |
| 7,706,524 B2 | 4/2010 | Zerbe |
| 7,746,764 B2 | 6/2010 | Rawlins |
| 7,787,572 B2 | 8/2010 | Scharf |
| 7,804,361 B2 | 9/2010 | Lim |
| 7,808,883 B2 | 10/2010 | Green |
| 7,841,909 B2 | 11/2010 | Murray |
| 7,869,497 B2 | 1/2011 | Benvenuto |
| 7,882,413 B2 | 2/2011 | Chen |
| 7,899,653 B2 | 3/2011 | Hollis |
| 7,907,676 B2 | 3/2011 | Stojanovic |
| 7,933,770 B2 | 4/2011 | Kruger |
| 8,036,300 B2 | 10/2011 | Evans |
| 8,050,332 B2 | 11/2011 | Chung |
| 8,055,095 B2 | 11/2011 | Palotai |
| 8,064,535 B2 | 11/2011 | Wiley |
| 8,085,172 B2 | 12/2011 | Li |
| 8,091,006 B2 | 1/2012 | Prasad |
| 8,106,806 B2 | 1/2012 | Toyomura |
| 8,159,375 B2 | 4/2012 | Abbasfar |
| 8,159,376 B2 | 4/2012 | Abbasfar |
| 8,180,931 B2 | 5/2012 | Lee |
| 8,185,807 B2 | 5/2012 | Oh |
| 8,199,849 B2 | 6/2012 | Oh |
| 8,199,863 B2 | 6/2012 | Chen |
| 8,218,670 B2 | 7/2012 | AbouRjeily |
| 8,245,094 B2 | 8/2012 | Jiang |
| 8,253,454 B2 | 8/2012 | Lin |
| 8,279,094 B2 | 10/2012 | Abbasfar |
| 8,295,250 B2 | 10/2012 | Gorokhov |
| 8,310,389 B1 | 11/2012 | Chui |
| 8,365,035 B2 | 1/2013 | Hara |
| 8,406,315 B2 | 3/2013 | Tsai |
| 8,429,495 B2 * | 4/2013 | Przybylski .................... 714/763 |
| 8,442,099 B1 | 5/2013 | Sederat |
| 8,442,210 B2 | 5/2013 | Zerbe |
| 8,443,223 B2 | 5/2013 | Abbasfar |
| 8,451,913 B2 | 5/2013 | Oh |
| 8,462,891 B2 | 6/2013 | Kizer |
| 8,472,513 B2 | 6/2013 | Malipatil |
| 8,498,344 B2 | 7/2013 | Wilson |
| 8,498,368 B1 | 7/2013 | Husted |
| 8,520,348 B2 | 8/2013 | Dong |
| 8,520,493 B2 | 8/2013 | Goulahsen |
| 8,539,318 B2 | 9/2013 | Cronie |
| 8,547,272 B2 | 10/2013 | Nestler |
| 8,577,284 B2 | 11/2013 | Seo |
| 8,578,246 B2 | 11/2013 | Mittelholzer |
| 8,588,254 B2 | 11/2013 | Diab |
| 8,588,280 B2 | 11/2013 | Oh |
| 8,593,305 B1 | 11/2013 | Tajalli |
| 8,638,241 B2 | 1/2014 | Sudhakaran |

(56) References Cited

U.S. PATENT DOCUMENTS

| | | | |
|---|---|---|---|
| 8,649,445 | B2 | 2/2014 | Cronie |
| 8,649,556 | B2 | 2/2014 | Wedge |
| 8,649,840 | B2 | 2/2014 | Sheppard, Jr. |
| 8,711,919 | B2 | 4/2014 | Kumar |
| 8,718,184 | B1 | 5/2014 | Cronie |
| 8,773,964 | B2 | 7/2014 | Hsueh |
| 8,780,687 | B2 | 7/2014 | Clausen |
| 8,782,578 | B2 | 7/2014 | Tell |
| 8,879,660 | B1 | 11/2014 | Peng |
| 8,897,134 | B2 | 11/2014 | Kern |
| 8,949,693 | B2 | 2/2015 | Ordentlich |
| 8,951,072 | B2 | 2/2015 | Hashim |
| 8,975,948 | B2 | 3/2015 | GonzalezDiaz |
| 8,989,317 | B1 | 3/2015 | Holden |
| 9,015,566 | B2 | 4/2015 | Cronie |
| 9,020,049 | B2 | 4/2015 | Schwager |
| 9,036,764 | B1 | 5/2015 | Hossain |
| 9,069,995 | B1 | 6/2015 | Cronie |
| 9,077,386 | B1 | 7/2015 | Holden |
| 9,093,791 | B2 | 7/2015 | Liang |
| 9,100,232 | B1 | 8/2015 | Hormati |
| 9,106,465 | B2 | 8/2015 | Walter |
| 9,124,557 | B2 | 9/2015 | Fox |
| 9,165,615 | B2 | 10/2015 | Amirkhany |
| 9,172,412 | B2 | 10/2015 | Kim |
| 9,197,470 | B2 | 11/2015 | Okunev |
| 9,281,785 | B2 | 3/2016 | Sjoland |
| 9,331,962 | B2 | 5/2016 | Lida |
| 9,362,974 | B2 | 6/2016 | Fox |
| 2002/0044316 | A1 | 4/2002 | Myers |
| 2002/0057592 | A1 | 5/2002 | Robb |
| 2002/0154633 | A1 | 10/2002 | Shin |
| 2003/0146783 | A1 | 8/2003 | Bandy |
| 2005/0057379 | A1 | 3/2005 | Jansson |
| 2005/0174841 | A1* | 8/2005 | Ho .......................... 365/185.03 |
| 2005/0213686 | A1 | 9/2005 | Love |
| 2007/0188367 | A1 | 8/2007 | Yamada |
| 2007/0263711 | A1 | 11/2007 | TheodorKramer |
| 2008/0104374 | A1 | 5/2008 | Mohamed |
| 2009/0059782 | A1 | 3/2009 | Cole |
| 2010/0046644 | A1 | 2/2010 | Mazet |
| 2010/0180143 | A1 | 7/2010 | Ware |
| 2010/0296556 | A1 | 11/2010 | Rave |
| 2011/0299555 | A1 | 12/2011 | Cronie |
| 2012/0152901 | A1 | 6/2012 | Nagorny |
| 2012/0161945 | A1 | 6/2012 | Single |
| 2013/0010892 | A1 | 1/2013 | Cronie |
| 2014/0226455 | A1 | 8/2014 | Schumacher |
| 2015/0010044 | A1 | 1/2015 | Zhang |
| 2015/0078479 | A1 | 3/2015 | Whitby-Strevens |
| 2015/0199543 | A1 | 7/2015 | Winoto |
| 2015/0333940 | A1 | 11/2015 | Shokrollahi |
| 2015/0381232 | A1 | 12/2015 | Ulrich |
| 2016/0020796 | A1 | 1/2016 | Hormati |
| 2016/0020824 | A1 | 1/2016 | Ulrich |
| 2016/0036616 | A1 | 2/2016 | Holden |

FOREIGN PATENT DOCUMENTS

| | | |
|---|---|---|
| JP | 2003163612 | 6/2003 |
| WO | 2009084121 | 7/2009 |
| WO | 2010031824 | 3/2010 |
| WO | 2011119359 | 9/2011 |

OTHER PUBLICATIONS

Brown, L., et al., "V.92: The Last Dial-Up Modem?", IEEE Transactions on Communications, IEEE Service Center, Piscataway, NJ., USA, vol. 52, No. 1, Jan. 1, 2004, pp. 54-61. XP011106836, ISSN: 0090-6779, DOI: 10.1109/tcomm.2003.822168, pp. 55-59.

Burr, "Spherical Codes for M-ARY Code Shift Keying", University of York, Apr. 2, 1989, pp. 67-72, United Kingdom.

Cheng, W., "Memory Bus Encoding for Low Power: A Tutorial", Quality Electronic Design, IEEE, International Symposium on Mar. 26-28, 2001, pp. 199-204, Piscataway, NJ.

Clayton, P., "Introduction to Electromagnetic Compatibility", Wiley-Interscience, 2006.

Dasilva et al., "Multicarrier Orthogonal CDMA Signals for Quasi-Synchronous Communication Systems", IEEE Journal on Selected Areas in Communications, vol. 12, No. 5 (Jun. 1, 1994), pp. 842-852.

Ericson, T., et al., "Spherical Codes Generated by Binary Partitions of Symmetric Pointsets", IEEE Transactions on Information Theory, vol. 41, No. 1, Jan. 1995, pp. 107-129.

Farzan, K., et al., "Coding Schemes for Chip-to-Chip Interconnect Applications", IEEE Transactions on Very Large Scale Integration (VLSI) Systems, vol. 14, No. 4, Apr. 2006, pp. 393-406.

Healey, A., et al., "A Comparison of 25 Gbps NRZ & PAM-4 Modulation used in Legacy & Premium Backplane Channels", DesignCon 2012, 16 pages.

International Search Report and Written Opinion for PCT/EP2011/059279 mailed Sep. 22, 2011.

International Search Report and Written Opinion for PCT/EP2011/074219 mailed Jul. 4, 2012.

International Search Report and Written Opinion for PCT/EP2012/052767 mailed May 11, 2012.

International Search Report and Written Opinion for PCT/US14/052986 mailed Nov. 24, 2014.

International Search Report and Written Opinion from PCT/US2014/034220 mailed Aug. 21, 2014.

International Search Report and Written Opinion of the International Searching Authority, mailed Jul. 14, 2011 in International Patent Application S.N. PCT/EP2011/002170, 10 pages.

International Search Report and Written Opinion of the International Searching Authority, mailed Nov. 5, 2012, in International Patent Application S.N. PCT/EP2012/052767, 7 pages.

International Search Report for PCT/US2014/053563, dated Nov. 11, 2014, 2 pages.

Notification of Transmittal of the International Search Report and the Written Opinion of the International Searching Authority, or the Declaration for PCT/EP2013/002681, dated Feb. 25, 2014, 15 pages.

Poulton, et al., "Multiwire Differential Signaling", UNC-CH Department of Computer Science Version 1.1, Aug. 6, 2003.

She et al., "A Framework of Cross-Layer Superposition Coded Multicast for Robust IPTV Services over WiMAX," IEEE Communications Society subject matter experts for publication in the WCNC 2008 proceedings, Mar. 31, 2008-Apr. 3, 2008, pp. 3139-3144.

Skliar et al., A Method for the Analysis of Signals: the Square-Wave Method, Mar. 2008, Revista de Matematica: Teoria y Aplicationes, pp. 109-129.

Slepian, D., "Premutation Modulation", IEEE, vol. 52, No. 3, Mar. 1965, pp. 228-236.

Stan, M., et al., "Bus-Invert Coding for Low-Power I/O, IEEE Transactions on Very Large Scale Integration (VLSI) Systems", vol. 3, No. 1, Mar. 1995, pp. 49-58.

Tallini, L., et al., "Transmission Time Analysis for the Parallel Asynchronous Communication Scheme", IEEE Transactions on Computers, vol. 52, No. 5, May 2003, pp. 558-571.

Wang et al., "Applying CDMA Technique to Network-on-Chip", IEEE Transactions on Very Large Scale Integration (VLSI) Systems, vol. 15, No. 10 (Oct. 1, 2007), pp. 1091-1100.

"Introduction to: Analog Computers and the DSPACE System," Course Material ECE 5230 Spring 2008, Utah State University, www.coursehero.com, 12 pages.

Counts, L., et al., "One-Chip Slide Rule Works with Logs, Antilogs for Real-Time Processing," Analog Devices Computational Products 6, Reprinted from Electronic Design, May 2, 1985, 7 pages.

Design Brief 208 Using the Anadigm Multiplier CAM, Copyright 2002 Anadigm, 6 pages.

Grahame, J., "Vintage Analog Computer Kits," posted on Aug. 25, 2006 in Classic Computing, 2 pages, http.//www.retrothing.com/2006/08/classic_analog_.html.

Jiang, A., et al., "Rank Modulation for Flash Memories", IEEE Transactions of Information Theory, Jun. 2006, vol. 55, No. 6, pp. 2659-2673.

(56) References Cited

OTHER PUBLICATIONS

Loh, M., et al., "A 3×9 Gb/s Shared, All-Digital CDR for High-Speed, High-Density I/O", Matthew Loh, IEEE Journal of Solid-State Circuits, Vo. 47, No. 3, Mar. 2012.
Notification of Transmittal of International Search Report and the Written Opinion of the International Searching Authority, for PCT/US2015/018363, mailed Jun. 18, 2015, 13 pages.
Notification of Transmittal of the International Search Report and the Written Opinion of the International Searching Authority, or the Declaration, dated Mar. 3, 2015, for PCT/US2014/066893, 9 pages.
Notification of Transmittal of the International Search Report and the Written Opinion of the International Searching Authority, or the Declaration, for PCT/US2014/015840, dated May 20, 2014, 11 pages.
Notification of Transmittal of the International Search Report and the Written Opinion of the International Searching Authority, or the Declaration, for PCT/US2014/043965, dated Oct. 22, 2014, 10 pages.
Notification of Transmittal of the International Search Report and the Written Opinion of the International Searching Authority, or the Declaration, for PCT/US2015/037466, dated Nov. 19, 2015.
Notification of Transmittal of the International Search Report and the Written Opinion of the International Searching Authority, or the Declaration, for PCT/US2015/039952, dated Sep. 23, 2015, 8 pages.
Notification of Transmittal of the International Search Report and the Written Opinion of the International Searching Authority, or the Declaration, for PCT/US2015/041161, dated Oct. 7, 2015, 8 pages.
Notification of Transmittal of the International Search Report and the Written Opinion of the International Searching Authority, or the Declaration, for PCT/US2015/043463, dated Oct. 16, 2015, 8 pages.
Oh, et al., Pseudo-Differential Vector Signaling for Noise Reduction in Single-Ended Signaling, DesignCon 2009.
Schneider, J., et al., "ELEC301 Project: Building an Analog Computer," Dec. 19, 1999, 8 pages, http://www.clear.rice.edu/elec301/Projects99/anlgcomp/.
Tierney, J., et al., "A digital frequency synthesizer," Audio and Electroacoustics, IEEE Transactions, Mar. 1971, pp. 48-57, vol. 19, Issue 1, 1 page Abstract from http://ieeexplore.
Zouhair Ben-Neticha et al, "The streTched-Golay and other codes for high-SNR finite-delay quantization of the Gaussian source at 1/2 Bit per sample", IEEE Transactions on Communications, vol. 38, No. 12 Dec. 1, 1990, pp. 2089-2093, XP000203339, ISSN: 0090-6678, DOI: 10.1109/26.64647.

* cited by examiner

1040 x = BIT(k,a)

if ( x = 0 ) then c= a and d = b if ( x = 1 ) then c= b and d = a

```
Set (π(0),π(1),…,π(K-1)) to (0,1,…,K-1)
For i   from 0 to m-1 do
        For j from 0 to K-1 in steps of $2^{i+1}$ do
                For k from 0 to $2^i$-1 do
                        if   b[i*K/2+j/2+k] = 1 then
                                Swap( π(j+k), π(j+k+$2^i$) )
                        fi
                end for
        end for
end for
```

FIG. 18

```
For i  from m-1 downto 0 do
        For j from 0 to K-1 in steps of $2^{i+1}$ do
            For k from 0 to $2^i$-1 do
                Set b[i*K/2+j/2+k] to π(j+k)[i]
                if   b[i*K/2+j/2+k] = 1 then
                    Swap( π(j+k), π(j+k+$2^i$) )
                fi
            end for
        end for
end for
```

FIG. 19

| y[0] | y[1] | y[2] | y[3] | A | B | C | o[0] | o[1] | o[2] | o[3] | o[4] | o[5] |
|---|---|---|---|---|---|---|---|---|---|---|---|---|
| 0 | 0 | 0 | 0 | 0 | 0 | 0 | 1 | 1 | 0 | 0 | 1 | 0 |
| 0 | 0 | 0 | 1 | 1 | 0 | 0 | 0 | 0 | 0 | 1 | 1 | 1 |
| 0 | 0 | 1 | 0 | 1 | 0 | 0 | 0 | 0 | 1 | 0 | 1 | 1 |
| 0 | 0 | 1 | 1 | 0 | 1 | 0 | 0 | 0 | 1 | 1 | 0 | 1 |
| 0 | 1 | 0 | 0 | 1 | 0 | 0 | 0 | 1 | 0 | 0 | 1 | 1 |
| 0 | 1 | 0 | 1 | 0 | 1 | 0 | 0 | 1 | 0 | 1 | 0 | 1 |
| 0 | 1 | 1 | 0 | 0 | 1 | 0 | 0 | 1 | 1 | 0 | 0 | 1 |
| 0 | 1 | 1 | 1 | 1 | 1 | 0 | 0 | 1 | 1 | 1 | 0 | 0 |
| 1 | 0 | 0 | 0 | 1 | 0 | 0 | 1 | 0 | 0 | 0 | 1 | 1 |
| 1 | 0 | 0 | 1 | 0 | 1 | 0 | 1 | 0 | 0 | 1 | 0 | 1 |
| 1 | 0 | 1 | 0 | 0 | 1 | 0 | 1 | 0 | 1 | 0 | 0 | 1 |
| 1 | 0 | 1 | 1 | 1 | 1 | 0 | 1 | 0 | 1 | 1 | 0 | 0 |
| 1 | 1 | 0 | 0 | 0 | 1 | 0 | 1 | 1 | 0 | 0 | 0 | 1 |
| 1 | 1 | 0 | 1 | 1 | 1 | 0 | 1 | 1 | 0 | 1 | 0 | 0 |
| 1 | 1 | 1 | 0 | 1 | 1 | 0 | 1 | 1 | 1 | 0 | 0 | 0 |
| 1 | 1 | 1 | 1 | 1 | 1 | 1 | 1 | 0 | 1 | 0 | 1 | 0 |

FIG. 21

DIFFERENTIAL VECTOR STORAGE FOR DYNAMIC RANDOM ACCESS MEMORY

CROSS-REFERENCES TO RELATED APPLICATIONS

This application is a continuation of U.S. application Ser. No. 13/843,785, filed Mar. 15, 2013, entitled "Differential Vector Storage for Dynamic Random Access Memory", which claims priority from the U.S. Provisional Patent Application No. 61/697,515, filed Sep. 6, 2012, entitled "Differential Vector Storage for Dynamic Random Access Memory", and are incorporated by reference herein in their entirety.

The following prior applications are herein incorporated by reference in their entirety for all purposes:

[Cronie-2] U.S. patent application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience."

[Cronie-3] U.S. Provisional Patent Application 61/697,540, filed Sep. 6, 2012, naming Harm Cronie and Brian Holden, entitled "Sorting Decoder."

FIELD OF THE INVENTION

The present inventions relate to, among other things, circuitry and techniques of dynamic random access memory and more particularly to methods and apparatus for generating, storing, reading, encoding, and decoding storage data.

BACKGROUND OF THE INVENTION

Random Access Memory ("RAM") is a form of data storage that is used in modern computing devices and other electronic devices to store information. RAM can be embodied in a dedicated RAM chip that has as its only purpose the storage of information, or it can be part of a chip or circuit that has other functions, such as a system-on-a-chip that has RAM, a processor and other elements on a chip. While not intending any limitation to particular examples, RAM examples herein will assume that the RAM is present on a chip (or a plurality of chips) where the chip is made using semiconductor processing techniques or other techniques to allow for information to be written to the RAM and later read back out of the RAM.

RAM is generally understood to be only capable of storing its contents while some power is applied to the RAM chip. "Storage" is a process that might encompass accepting data and address locations, writing that data to the specified address locations, maintaining some state of the RAM chip and/or the data, receiving read requests for data from address locations specified in the read requests and outputting that data. Preferably, unless there is a power interruption, the data read from a given address location of a RAM chip is the same as the data written to that address location with greater than some probability.

For a RAM to have storage capability, it has some structures that store data/stage. This can be through the use of electronic devices or elements, such as transistors, capacitors, and the like. Some RAM is referred to as Dynamic Random Access Memory ("DRAM"), in that the information is stored in devices or elements that need to be maintained or refreshed in order to hold onto the stored data. For example, in some modes of operation, a DRAM stores information as charge on a capacitor and the charge is maintained until power is removed or the charge is changed during a write operation. Information can be read and/or written using a transistor coupled with the capacitor.

In a known DRAM chip, there are a number of addressable data cells and each data cell comprises one transistor and one capacitor. This is often referred to as a 1-transistor-1-capacitor (1T1C) DRAM data cell. To store one bit of data into a 1T1C DRAM cell, the capacitor is charged to one of two signal levels, with the particular one of the two signal levels determined by the bit being written to the cell. Without loss of generality, when one bit is being referenced, the two possible values for the bit are referred to as "0" and "1".

To read a value of the DRAM cell, the cell is connected to a bitline BL and to a word line WL. During sensing, the cell capacitance is connected to a much larger BL capacitance and the resulting attenuated cell signal on the BL is compared by a sensitive differential sense amplifier with a similarly attenuated reference voltage obtained, as an example, from a similar BL having no activated cells. The amplified cell signal can then be stored back into the cell. This operation is often called the "refresh" operation. Refresh operations are necessary in a DRAM since the capacitors used to store the information exhibit leakage and therefore need to be refreshed to guarantee the integrity of the data stored. In such a scheme, storing the data "0" can correspond to the voltage level $V_{ss}$ whereas storing the data "1" could correspond to the voltage level $V_{dd}$, with $V_{ss}$ typically being a higher voltage level relative to $V_{dd}$. Of course, this relationship is not required. The voltage levels might be referred to by values relative to a ground plane, or some other circuit or chip reference. In many examples herein, voltages are relative to $V_{ss}$ and for clarity, this is not specified each time. Thus, when voltages are referred to as numbers or quantities, it might be that $V_{ss}=0$. Unless otherwise indicated, the units for such numbers or quantities are volts, but other scales might be used instead.

Two parameters of importance in the design of a DRAM are the "density" and the energy consumption. The density of a DRAM can be described by the number of bits that can be stored in a given unit of area. Generally, DRAMs of higher density are preferred over DRAMs of lower density because of the smaller packaging, and several other economic advantages. A large portion of the energy consumption of a DRAM is spent in the "refresh" operation whereby the information in each cell is read, amplified, and written back to the cell. This refresh operation is necessitated by the fact that the capacitors used to store information have small capacitance because of their physical size, and hence lose charge over time. Because of process variations of the electronic components used in a DRAM, the refresh interval, i.e., the amount of time passed between two successive refreshes of a cell, has to be short enough so that the worst cells still have not lost their information at the time of refresh. According to the standards set forth by the "Joint Electron Devices Engineering Council" (JEDEC), DRAM manufacturers need to make sure that the process variations which their devices are subject to are such that with the refresh interval of 64 ms (milliseconds), their devices do not lose data (with some level of certainty).

The response of the DRAM industry to the problem of storage density has been mostly confined to feature size reduction due to process technology improvements, reduction of the footprint of a storage cell, and sometimes other approaches such as 3D-stacking. Feature size and footprint reduction need to obey the rule that the cell size has to be $F^2$ or larger, wherein F is the so-called minimum feature size and depends on the process technology used. A process technology of 32 nm, for example, has 32 nm as the value of F. DRAM units in use today have a cell size equal to $6*F^2$.

Experimental designs have been reported that reduce this size even further, but reducing cell size is still a big challenge for the industry.

FIG. 1 is an exemplary block diagram schematic of a DRAM device 100 that is a conventional DRAM storage device. DRAM device 100 comprises a column decoder 130, I/O buffers 120, sense amplifiers 145, row decoders 110, and a memory area 140. Memory area 150 contains a plurality of actual memory cells. The memory cells are connected, via bitlines 133, to sense amplifiers 145 and column decoder 130, and, via wordlines 150, to row decoders 110. One of the memory cells in memory area 140 is indicated as memory cell 135 in FIG. 1 shown by a circle at an intersection of one wordline and one bitline. Although not shown explicitly, there can be connections between I/O buffers 120 and other elements of DRAM device 100, and there can be inputs of DRAM device 100 that are for row decoders 110 and outputs of DRAM device 100 that are for column decoder 130.

In operation, to write to a memory cell in response to DRAM device 100 receiving an input comprising the value to be written and a memory location to be written to, DRAM device 100 conveys the memory location (or at least part of it) to row decoders 110, which then activates one of wordlines 150 and DRAM device 100 conveys part of the memory location to column decoder 130, which then activates one or more of bitlines 133. DRAM device 100 might store the data temporarily in I/O buffers 120 and then move the data into the selected memory cell(s) via sense amplifiers 145. DRAM device 100's on-board logic (not explicitly shown) can charge the cell capacitance or discharge it, using the bitlines and the wordlines, based on the data to be written.

FIG. 2 provides an expanded view of memory cell 135, showing additional structure. Memory cell 135 is shown comprising a transistor 230 and a capacitor 250. Parts of a bitline 133(i) and a wordline 150(j) are shown and in this example, memory cell 135 is in row j and column i of memory area 140. Transistor 230 is shown coupled to bitline 133(i), wordline 150(j) (at the gate of transistor 230), and capacitor 250. The other side of capacitor 250 can be coupled to a ground, a reference, or elsewhere.

Capacitor 250 stores a charge that corresponds to the data state of the data stored in memory cell 135. During a write operation, when wordline 150(j) is activated (by row decoders 110; see FIG. 1), transistor 230 turns on and charge from bitline 133(i) transfers to capacitor 250. The charge stored in memory cell 135 is used to determine the "value" stored therein. Memory cell 135 can be read by activating wordline 150(j) and sensing the charge on capacitor 250 using bitline 133(i).

FIG. 3 illustrates a memory circuit where pre-charging is used. FIG. 3 shows portions of two memory arrays, with a first memory array 300 coupled to wordlines 302(1)-(3) and bitlines 320(a)-(c), and a second memory array 301 coupled to wordlines 312(1)-(3) and bitlines 330(a)-(c). Bitlines 320(a)-(c) and bitlines 330(a)-(c) are coupled to corresponding sense amplifiers 350(a)-(c), i.e., bitline 320(a) and bitline 330(a) are inputs to sense amplifier 350(a) and so on.

With bitlines 320 pre-charged to $V_{dd}/2$, bitlines 330 will be read by opening wordlines 312 and the difference of the charge to the pre-charged values of bitlines 320 are measured by sense amplifiers 350. These readings are then forwarded to row decoders (not shown) for obtaining the bit values in each cell. Thus, in conventional DRAM, each memory cell stores a charge in its associated capacitor and outputs a charge from the associated capacitor that corresponds directly to the value of the data received by the DRAM's I/O buffers and output from the I/O buffers.

The measurements of the charges in each cell are done with respect to the fixed reference $V_{dd}/2$. This has some significant implications. One of the implications is that the charges in the cells cannot fall below $V_{dd}/2$ if appropriate data state is to be reliably and repeatedly determined, and a suitable threshold depends on the sensitivity of the sense amplifiers.

The voltage read, Vr, from the capacitor at time t in a typical model, can be expressed as in Equation 1, wherein V is the original voltage applied to the capacitor, t is the time passed since the original voltage was applied, a is a decay parameter, and i is a normal random variable modeling the process variation of the cells.

$$Vr = Ve^{-\frac{t^a}{\tau}} \qquad \text{(Eqn. 1)}$$

From Equation 1, it should be apparent that memory cells storing a greater charge in their capacitor decay faster than cells storing a smaller charge. To guarantee the integrity of the DRAM device, appropriate refresh intervals are therefore necessary.

This constraint is more significant for multilevel DRAMs, where information is stored as more than two charge levels. In multilevel DRAMs, the decay between some levels is faster than others and refreshing needs to take into account these variations. Note that, per Equation 1, the charge on the capacitor would go from $V_{dd}$ to below $V_{dd}/2$, for example, in about the same time that it needs to drop, for example, from $V_{dd}/2$ to below $V_{dd}/4$.

REFERENCES

[Ferrant] U.S. Pat. No. 7,085,153 to Ferrant et al., entitled "Semiconductor Memory Cell, Array, Architecture and Device, and Method of Operating Same" issued Aug. 1, 2006.

BRIEF SUMMARY

In embodiments of storage devices, circuitry is provided for storing data using groups of memory cells, wherein each memory cell of a group is capable of storing charge at three or more specified levels. A group of memory cells forms a vector storage element capable of storing codewords of a voltage code, wherein the number of possible codewords is greater than or equal to $2^n$, thereby allowing distinct codewords to encode for each possible n-bit value. The vector storage element comprises k cells and the corresponding codewords comprise k entries, wherein a cell in an i-th position of the vector storage element can store an electrical quantity, such as a voltage, current, etc., corresponding to an i-th entry of the corresponding codeword. The set of possible entry values and stored electrical quantities is greater than two for at least some of the vectors and some of the vector's entries. In some embodiments, there are $2^n$ k-entry codewords and n>k. A voltage code has a "code rate" of n/k that is determined by the number of distinct codewords and the number of cells needed to store codewords. The voltage code is such that, for at least one position of a vector, there are at least three vectors having distinct entry values at that position and, for at least a subset of the possible codewords, when the entry values are assigned numerical summable values, the sum of the entry values over the positions of the each vector is constant from vector to vector in that subset. The assigned numerical summable values might correspond to voltages relative to some reference or otherwise, such as a voltage stored as charge on a capacitor.

In specific embodiments, the storage device might be an integrated circuit device, a discrete memory device, or a device having embedded memory. The storage device might include row decoder circuitry and column decoder circuitry such that row and column signals input to the storage device access, indicate, designate, identify, and/or select a subset of the memory cells, such as one or more vector storage elements. The memory cells might form a memory area on the device, with the memory cells arranged in a matrix of rows and columns. The storage device also includes data inputs/outputs and data encoder/decoder circuitry to generate vectors from input data and determine output data from vectors read from a vector storage element.

In specific embodiments, the data encoder circuitry receives an input corresponding to n input bits and generates a voltage codeword comprising k values that sum to a constant and can vary among three or more values, with n<k, while the data decoder circuitry receives a voltage codeword comprising k values, determines intended values for the k values (which might be altered by physical processes between reading and writing) and generates an output corresponding to n output bits.

Other objects and/or advantages of the present invention will be apparent to one of ordinary skill in the art upon review of the Detailed Description and the included figures.

BRIEF DESCRIPTION OF THE DRAWINGS

Various embodiments in accordance with the present disclosure will be described with reference to the drawings in FIG. 1 through FIG. 21.

FIG. 18 is pseudocode for a ranking encoder.

FIG. 19 is pseudocode for a ranking decoder.

FIG. 21 shows a table of values obtained by the process of FIG. 20.

DETAILED DESCRIPTION OF THE INVENTION

Figure 1:
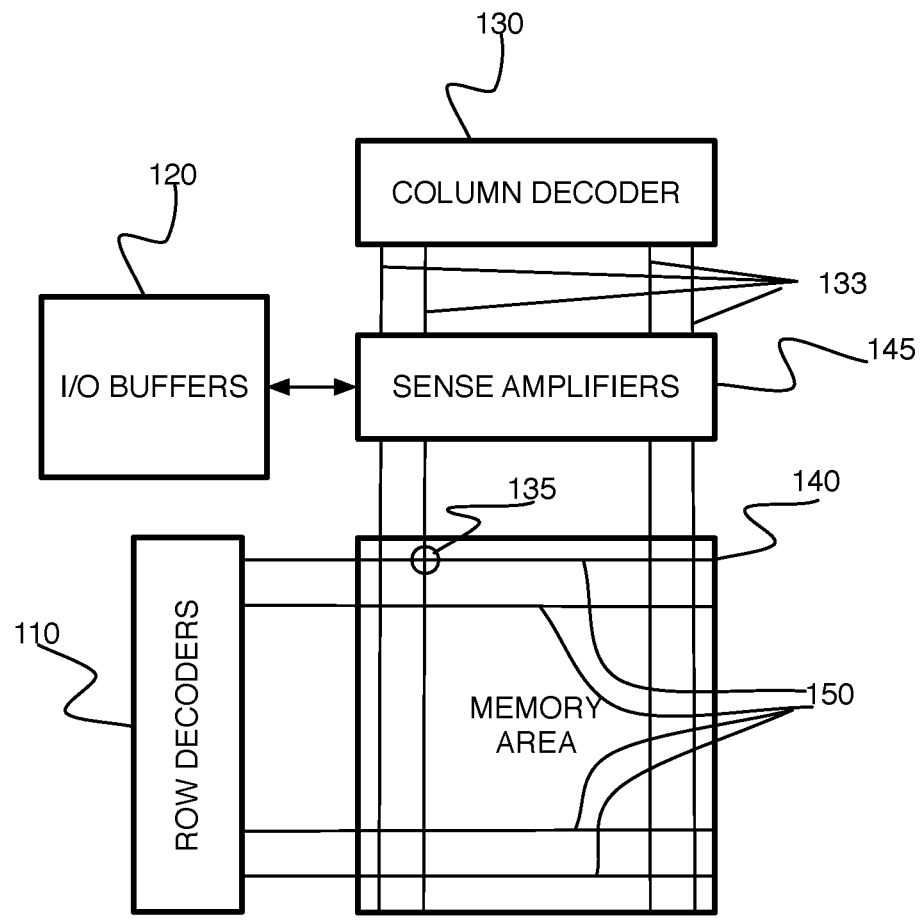
FIG. 1 is a schematic diagram illustrating a conventional memory device.
Figure 2:
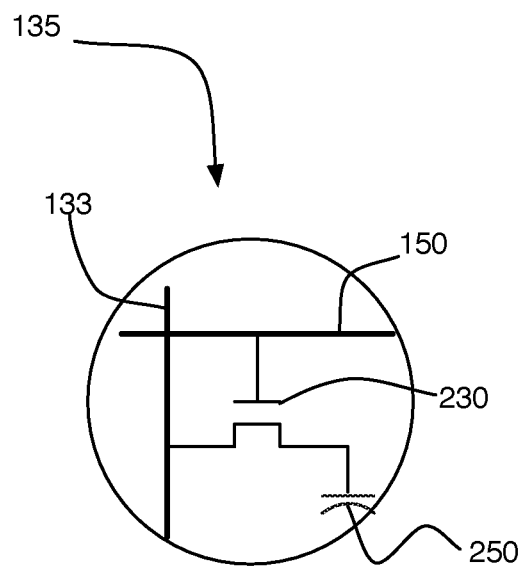
FIG. 2 is a schematic diagram illustrating a memory cell as might be present in the conventional memory device of FIG. 1.
Figure 3:
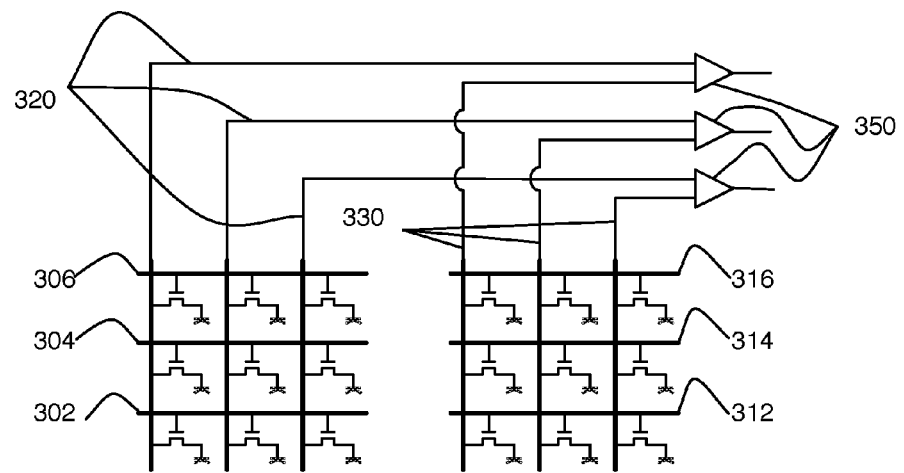
FIG. 3 is a schematic diagram illustrating a differential sense amplifier in a conventional memory device.

There are many inventions described and illustrated herein, as well as many aspects and embodiments of those inventions. In one aspect, the present inventions relate to, among other things, circuitry and techniques for use with dynamic random access memory (for example, a discrete type or embedded type configuration or architecture). In one aspect, the circuitry and techniques encode n bits of storage data to generate a codeword of length k bits based on a voltage code, where n is greater than k. In a storage device, circuitry is provided for storing data using groups of memory cells, wherein each memory cell of a group is capable of storing charge at three or more specified levels. A group of memory cells forms a vector storage element capable of storing codewords of a voltage code, wherein the number of possible codewords is greater than or equal to $2^n$, thereby allowing distinct codewords to encode for each possible n-bit value. The vector storage element comprises k cells and the corresponding codewords comprise k entries, wherein a cell in an i-th position of the vector storage element can store an electrical quantity, such as a voltage, current, etc., corresponding to an i-th entry of the corresponding codeword. The set of possible entry values and stored electrical quantities is greater than two for at least some of the vectors and some of the vector's entries. In some embodiments, there are $2^n$ k-entry codewords and n>k. A voltage code has a "code rate" of n/k that is determined by the number of distinct codewords and the number of cells needed to store codewords. The voltage code is such that, for at least one position of a vector, there are at least three vectors having distinct entry values at that position and, for at least a subset of the possible codewords, when the entry values are assigned numerical summable values, the sum of the entry values over the positions of the each vector is constant from vector to vector in that subset. The assigned numerical summable values might correspond to voltages relative to some reference or otherwise, such as a voltage stored as charge on a capacitor.

The target voltages might be selected from a set of possible target voltages having a maximum value and a minimum value, relative to some reference. For example, the reference might be the ground plane ($V_{ss}$) and the set of possible target voltages being somewhere between 0 volts and $V_{dd}$ volts (a supply voltage). As but one example, the set of possible target voltages is $\{0.75*V_{dd}, 0.50*V_{dd}, 0.25*V_{dd}, 0\}$ or as another example, $\{0.5*V_{dd}, 0.4*V_{dd}, 0.3*V_{dd}, 0\}$. The individual entries of the vector may be interpreted as voltages, which are written or injected into associated memory cells. After encoding the storage data, the codeword is stored in k associated memory cells. During a read operation, the data stored in the k associated memory cells are read and decoded to recover the n bits of original storage data. The memory cells may be dynamic random access memory ("DRAM") cells.

Some advantages of some embodiments are that memory density is enhanced in that n data bits of storage data (after encoding) are stored in k associated memory cells as a codeword, where n>k, and/or that refresh considerations are relaxed, wherein refresh considerations are based, at least in part, on the relative charge retention characteristics of the memory cells storing the coded storage data of the codeword.

The circuitry and techniques described herein may provide a dynamic random access memory implementing read operations that require no reference signal (voltage or current) to read the data states stored in the memory cells and/or decode the encoded storage data to recover the original data. Here, in one embodiment, the read and decode circuitry may recover the original data based on, for example, the relative voltage levels stored in the k associated memory cells (which stored the codeword that is representative of the original storage data).

Notably, as intimated above, the dynamic random access memory described herein may be implemented in a discrete type configuration/architecture (for example, a stand-alone memory device) and/or embedded type configuration/architecture (for example, an integrated circuit device having logic circuitry and one or more dynamic random access memory cells and/or arrays incorporated therein or thereon). Moreover, one or more aspects of the circuitry and techniques described herein (for example, the encoding and/or decoding circuitry and techniques) may be implemented in circuitry which is located "off-chip" relative to the discrete type and/or embedded type configuration/architectures. Other physical configurations or architectures which implement the techniques described herein might be used.

Figure 4A:
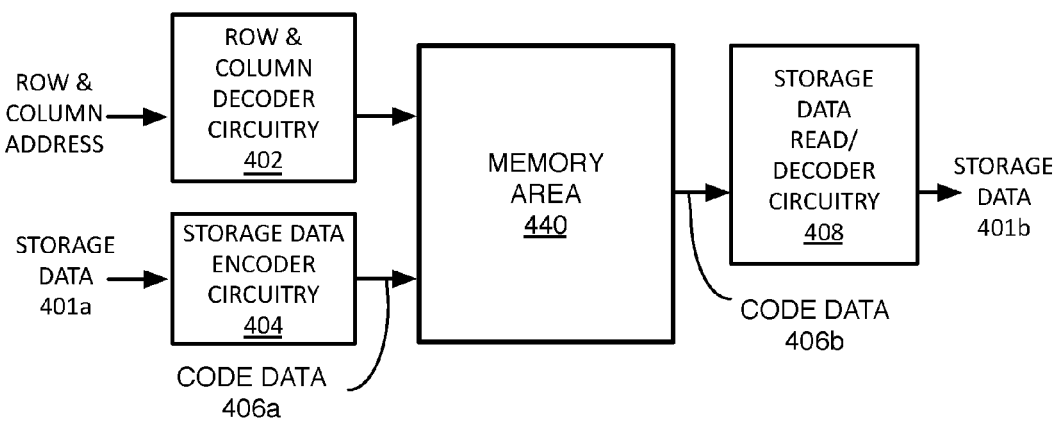
FIGS. 4A and 4B provide block diagrams of a memory device which performs operations on groups of memory cells.

FIG. 4A illustrates an embodiment of an integrated circuit device (for example, a discrete memory device and/or device having embedded memory) according to aspects of the present invention. The device is shown including row and column decoder circuitry 402, storage data encoder circuitry 404, a memory area 440 comprising a plurality of memory cells (not shown), and storage data read/decoder circuitry 408. As shown, row and column decoder circuitry 402 receive row/column addresses as inputs and have outputs to memory area 440 to provide for selection of particular memory cells of memory area 440. Storage data encoder circuitry 404 is shown with input for storage data 401a and output for conveying code data 406a to memory area 440. Storage data read/decoder circuitry 408 is shown with input for reading code data 406b from memory area 440 and output for conveying storage data 401 to an output. For a given set of rows and/or columns where code data is stored, it is desirable that code data 406b be close enough to code data 406a so that storage data 401b is equal to 401a with a sufficiently high probability (excepting, of course, when there is a power loss or other erasing event between the read and write). Some typical probabilities might be greater than $1-10^{\wedge}15$ probability of correct reads.

In this example, storage data encoder circuitry 404 generates a codeword of length k bits using the n bits of storage data 401a, where n is greater than k. Storage data encoder circuitry 404 generates the codeword based on a voltage code, such as the voltage codes described herein.

In one embodiment, storage data encoder circuitry 404 includes mixed signal circuitry to generate the voltage levels for the individual entries of code data 406a. In addition, storage data encoder circuitry 404 may also include one or more state machines, processors (suitably programmed) and/or field programmable gate arrays (or combinations thereof); indeed, any circuitry (for example, discrete or integrated logic, state machine(s), processor(s) (suitably programmed) and/or field programmable gate array(s) (or combinations thereof)) now known or later developed may be employed to calculate, generate and/or determine the codeword using the storage data.

In operation, storage data encoder circuitry 404 may perform or execute one or more applications, routines, programs and/or data structures that implement particular methods, techniques, tasks or operations described and illustrated herein. The functionality of the applications, routines or programs may be combined or distributed among a plurality of circuits (which may be integrated with storage data encoder circuitry 404 or separate therefrom). Further, the applications, routines or programs may be implemented by storage data encoder circuitry 404 using any programming language whether now known or later developed, including, for example, assembly, FORTRAN, C, C++, and BASIC, whether compiled or uncompiled code.

In one embodiment, storage data encoder circuitry 404 encodes storage data 401a to be stored in memory area 440 into groups of k values or memory cells 435. These values need not be binary, i.e., a memory cell might be charged to a target voltage where the target voltage is one of three or more possible target voltages. The row and column decoder circuitry indicates, identifies, and designates the address of the specific memory cells. The memory cells may be organized in groups of at least two cells and preferably in groups of k memory cells. In general, the vector of k values or memory cells obtained may belong to a voltage code. For purposes of this description, a voltage code of length k (which is stored in k memory cells) is a collection of vectors of length k such that, for at least one coordinate position 1, k, there are at least three vectors having distinct values for their entry at that coordinate position, and the collection of vectors is such that the sum of the entries of each vector in the collection is the same value, where the sum is the sum of numerical values, such as voltages or otherwise, of each of the entries.

Notably, the second condition may have an advantage that it makes the voltage code invariant to common leakage of the cells: if the cells leak at the same rate, then the vector read from the cells after leakage also satisfies the second condition above. In certain embodiments, this leads to better refresh properties of the new DRAM architecture, as the refresh intervals may be made longer without running the risk of losing information stored in the cells.

Elements of a voltage code are collectively referred to as "voltage codewords" or simply "codewords" hereinafter. Voltage codes can be used to store information in the following way: where the voltage code has $2^n$ elements, n bits can be used to uniquely address one of the codewords. The operation of computing the codeword of length k from the n bits is referred to as the "encoding operation." The operation of recovering the n bits from a codeword is referred to as the "decoding operation." The ratio between n, the number of bits stored, and k, the number of cells used to store those bits, is called the "code rate" of the voltage code, or just "rate." In applications, a larger rate is typically preferred over a smaller rate, all else being equal.

Figure 5:
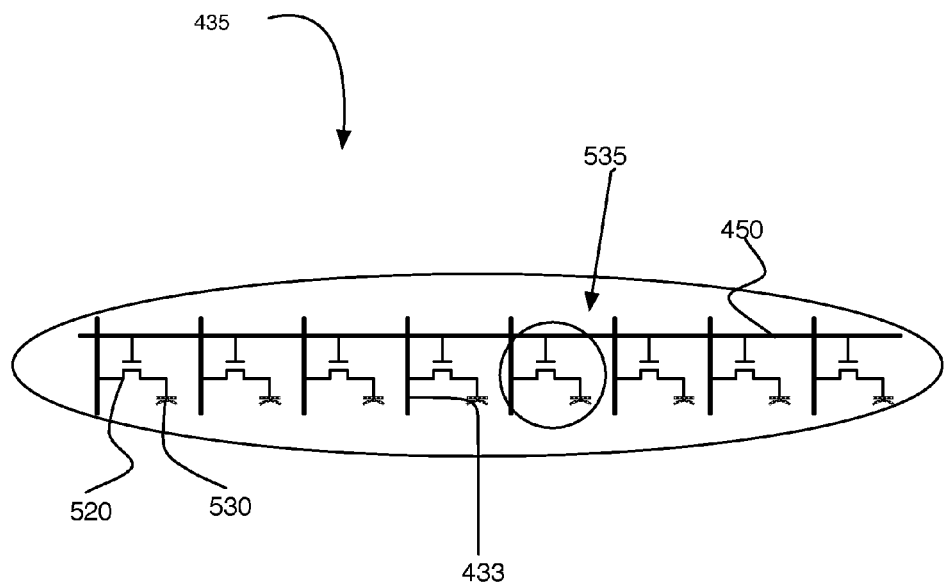
FIG. 5 is a schematic diagram of one group of memory cells as in FIG. 4.

FIG. 5 is a schematic diagram illustrating a cell group 435 of memory cells as might be used to store a vector corresponding to a voltage codeword. The vector is stored as k target voltages applied to k memory cells. Cell group 435 comprises k memory cells (one such memory cell 535 is indicated in FIG. 5 with a circle) and each memory cell might comprise a transistor 520 and a capacitor 530 as illustrated. In FIG. 5, k=8, but other values are also possible, as explained elsewhere herein. Also shown in FIG. 5 is one wordline 450 that is coupled to the gates of all of the memory cell's transistor of cell group 435, and bitlines, such as bitline 433, each coupled to a memory cell's transistor.

Suppose the set of possible target voltages is $\{0.5*V_{dd}, 0.4*V_{dd}, 0.3*V_{dd}, 0\}$ and suppose further that k=4. For the voltage codeword (0, 0.5, 0.4, 0.3), voltages might be written or injected into the associated memory cells, for example, using mixed signal circuitry of storage data encoder circuitry 404, so that a voltage of 0 v is written into a first memory cell of the four cells, a voltage of $0.5*V_{dd}$ is written or applied to the second memory cell, a voltage of $0.4*V_{dd}$ to the third memory cell, and finally a voltage of $0.3*V_{dd}$ to the fourth memory cell in the associated group of memory cells.

When information is read from the cells, storage data read/decoder circuitry 408 receives code data 406b stored in associated memory cells (the data, in combination, being the codeword of k bits stored in k memory cells) and, based thereon, decodes the codeword to retrieve the original storage data of n bits (storage data 401b). Storage data read/decoder circuitry 408 includes mixed signal circuitry (which may, in part or in whole, be the same circuitry employed by or in storage data encoder circuitry 404) to generate the codeword of the voltage code from the voltages stored in the associated memory cells and which are sensed by the mixed signal circuitry of storage data read/decoder circuitry 408.

Notably, these values read from the memory cells may be amplified and stored back into the associated memory cells, which may be the situation during a refresh operation, or they may be provided to decoder circuitry of the storage data read/decoder circuitry 408 which may generate and/or output the original n bits of storage data 401b from the information. In some embodiments, the refresh may also first perform a decoding, and then an encoding operation followed by an application of voltages to the various cells in the group.

The storage data read/decoder circuitry 408 may also include one or more state machines, processors (suitably programmed) and/or field programmable gate arrays (or combinations thereof); indeed, any circuitry (for example, discrete or integrated logic, state machine(s), processor(s) (suitably programmed) and/or field programmable gate array(s) (or combinations thereof)) now known or later developed may be employed to calculate, generate and/or determine the codeword using the storage data. In operation, the storage data read/decoder circuitry may perform or execute one or more applications, routines, programs and/or data structures that implement particular methods, techniques, tasks or operations described and illustrated herein. The functionality of the applications, routines or programs may be combined or distributed. Further, the applications, routines or programs may be implemented by the storage data encoder circuitry using any programming language whether now known or later developed, including, for example, assembly, FORTRAN, C, C++, and BASIC, whether compiled or uncompiled code.

Figure 4B:
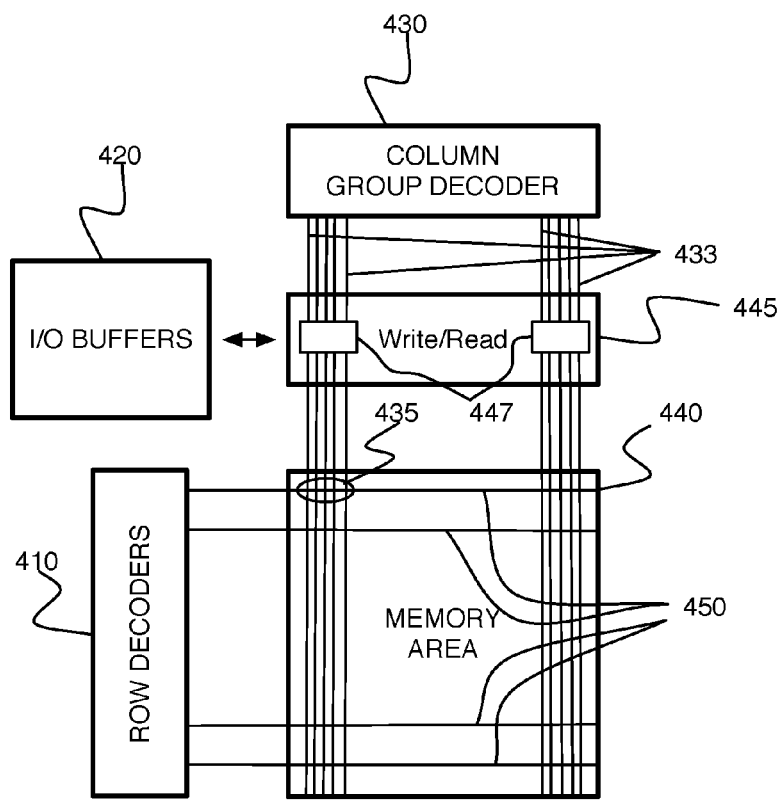

With reference to FIG. 4B, in another embodiment, the DRAM storage device includes, in addition to the conventional elements I/O buffers 420, row decoders 410, memory area 440, word lines 450, and bitlines 433, a column group decoder 430, and a write and read circuit 445 (abbreviated as "Write/Read circuit" hereinafter). The DRAM cells are organized in groups of at least two such cells, as shown in FIG. 5. Each group comprises a number k of cells wherein each cell may comprise one transistor 520 and one capacitor 530. By encoding data as vectors, the contents of each memory cell will likely be not totally independent of the contents of other memory cells in its group. The correlation of information between the cells in a group can be used to store more information on average in every cell.

Upon receiving the bits to be stored, the write/read circuit 445 encodes them into groups of k values. As noted above, these values may not be binary, and in general the vector of k values obtained may belong to a voltage code.

With continued reference to FIG. 4B, the write/read circuit 445 generates the codeword upon receiving n bits of the storage data. The resulting vector may have entries that are non-negative, and at most equal to a given bound, for example the value of the $V_{dd}$.

When information is read from the cells, the Write/Read circuit 445 creates a codeword of the voltage code from the sensed voltages. Again, these values may be amplified and stored back, which may be the case during a refresh operation, or they may be forwarded to a decoder circuit which may create the original n bits from the information read. In some embodiments the refresh may also first perform a decoding, and then an encoding operation followed by an application of voltages to the various cells in the group.

Example of a Voltage Code of Rate 4/3

In one embodiment, the storage device employs a voltage code in which the vectors have length 6, and which has 256 elements, thereby allowing the storage of 8 bits into 6 cells. The rate of this voltage code is thus 8/6=4/3.

The elements of this voltage code comprise vectors of the form $(a_0, \ldots, a_5)+(b_0, \ldots, b_5)$ wherein $(a_0, \ldots, a_5)$ is a permutation of the vector $(0, 0, 0, ¼, ¼, ¼)$ and $(b_0, \ldots, b_5)$ is a permutation of the vector $(0, 0, 0, ½, ½, ½)$. The factors ½ and ¼ in the scheme presented here are only for illustrative purposes, and may not be optimal. They can be optimized depending on the parameters of the random variable in Equation 1.

There are 20 vectors of each kind, leading to 400 codewords. To choose 256 of them, we may proceed as follows: for a given vector $(x[0], x[1], x[2], \ldots, x[7])$ we apply the process of FIG. 20 to $(x[0], x[1], x[2], x[3])$ to obtain a vector $(a_0, \ldots, a_5)$ and we apply the same process to $(x[4], x[5], x[6], x[7])$ to obtain a vector $(b_0, \ldots, b_5)$. The final vector will then be $$¼*(a_0, \ldots, a_5) + ½*(b_0, \ldots, b_5).$$

The process of FIG. 20 operates as follows: its input consists of four bits $y[0], \ldots, y[3]$. In Step 2020 three quantities A, B, C are computed as follows $$A = y[0]\hat{}y[1]\hat{}y[2]\hat{}y[3]$$

$$B = (y[0]\&y[1])\hat{}(y[2]\&y[3])\hat{}((y[0]\hat{}y[1])\&(y[2]\hat{}y[3]))$$

$$C = y[0]\&y[1]\&y[2]\&y[3]$$

where "$\hat{}$" denotes the XOR operation, and & is the logical AND. In Step 2030 a determination is made to whether C=0 and at the same time not both A and B are 0. If that is the case, then the bit vector $(y[0], y[1], y[2], y[3], \neg B, NAND(A, B))$ is output in Step 2050 wherein $\neg B$ is the negation of B, and NAND(A, B) is the NAND of A and B, i.e., $\neg(A\&B)$. If the result of the test in Step 2030 was negative, then Step 2040 tests whether the negative test was due to (A, B) being (0, 0) or not. If that was the case, then the vector (1, 1, 0, 0, 1, 0) is output in Step 2060. If that was not the case, then the vector (1, 0, 1, 0, 1) is output in Step 2070.

Figure 20:
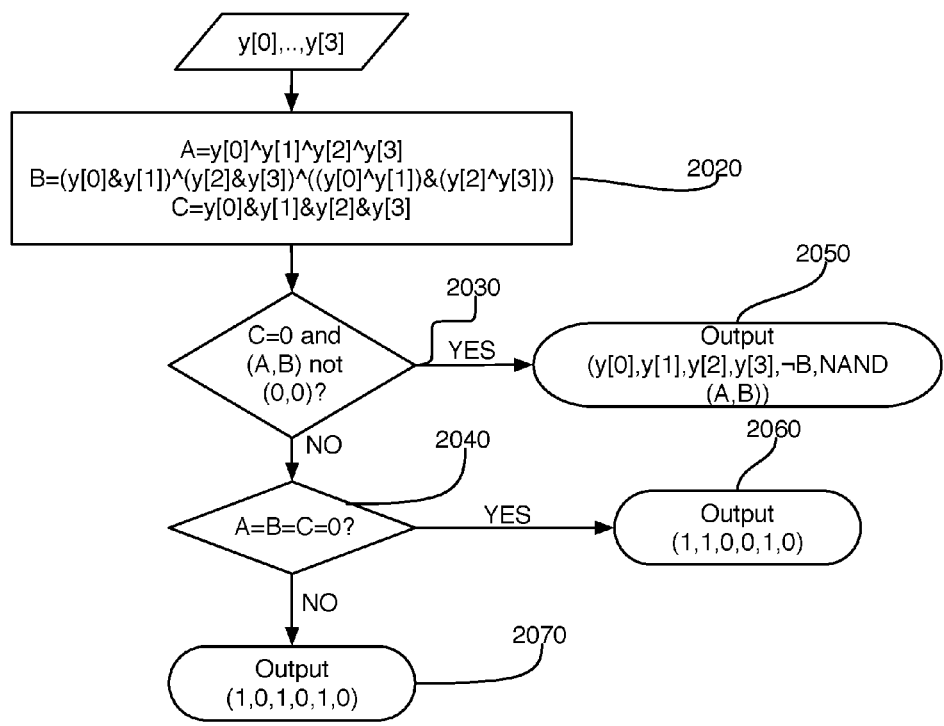
FIG. 20 is a flow chart for the process of selecting suitable rate 4/3 vectors.

A table of values of the process in FIG. 20 is given in FIG. 21. The first four columns in the table corresponds to the four input bits $y[0], \ldots, y[3]$. The next three columns correspond to the value A, B, C computed in the process of FIG. 20, and the final 6 columns correspond to the output vector of that process, denoted by $o[0], \ldots, o[5]$.

As an example of the entire process, where the bit sequence $(x[0], \ldots, x[7])=(1, 0, 0, 1, 1, 1, 0, 0)$, the process of FIG. 20 is applied first to the bit sequence $(x[0], \ldots, x[3])=(1, 0, 0, 1)$ to obtain the output vector (1, 0, 0, 1, 0, 1), and then the process of FIG. 20 is applied to the bit sequence $(x[4], \ldots, x[7])=(1, 1, 0, 0)$ to obtain the output (1, 1, 0, 0, 0, 1). The final output is then the vector $$¼*(1,0,0,1,0,1) + ½*(1,1,0,0,0,1) = (¾, ½, 0, ¼, 0, ¾).$$

The decoding process for this voltage code is implemented by the storage data encoder circuitry. When reading the word $(c_0, \ldots, c_5)$, we may start by determining the positions of the three largest entries. If these positions are denoted by j, k, l, then these positions may determine a vector $(v_0, \ldots, v_5)$ wherein $v_j = v_k = v_l = 1$, and the other entries are zero. If $(v_4 \& \neg v_5)=1$, then $x[4]=x[5]=x[6]=x[7]=v_2$, and otherwise $x[4]=v_0, x[5]=v_1, x[6]=v_2$, and $x[7]=v_3$. Next, the vector $\beta/2*(v_0, \ldots, v_5)$ is subtracted from the vector $(c_0, \ldots, c_5)$ to obtain another vector $(d_0, \ldots, d_5)$, and the positions of the three largest entries of this vector are determined. Here $\beta$ is a parameter that may depend on the refresh time used in the particular DRAM element using this voltage code. If these positions are denoted by m, n, p, then these positions may determine a vector $(w_0, \ldots, w_5)$ wherein $w_m=w_n=w_p=1$, and the other entries are zero. If $(w_4 \& \neg w_5)=1$, then $x[0]=x[1]=x[2]=x[3]=w_2$, and otherwise $x[0]=w_0$, $x[1]=w_1$, $x[2]=w_2$, and $x[3]=w_3$.

An example is provided by the voltage codeword (¾, ½, 0, ¼, 0, ¾). Using Equation 1 above to model the leakage of the individual cells, and picking for the mean and the standard deviation of the random variable X the values 0.3 and 0.03, for the time t the value of 0.04 seconds (40 milliseconds), and for the parameter α the value 0.5, then the vector read after 0.04 seconds may have been changed to the vector $(c_0, c_1, \ldots, c_5) = (0.358, 0.236, 0, 0, 0.147, 0, 0.405)$.

Here we may choose for $\beta$ the average value of the random variable in Equation 1 after 0.04 seconds which may be calculated to be approximately equal to 0.51. The entries with indices 0, 1, 5 are the largest ones in the read vector, and the vector $(v_0, \ldots, v_5)$ is therefore computed as (1, 1, 0, 0, 0, 1). Since $(v_4 \& \neg v_5) = (0 \& 0) = 0$, we obtain $x[4]=1$, $x[5]=1$, $x[6]=0$, $x[7]=0$. Subtracting $\beta/2*(v_0, \ldots, v_5)$ from $(c_0, \ldots, c_5)$ leads to the vector $(0.358, 0.236, 0, 0, 0.147, 0, 0.405) - (0.255, 0.255, 0, 0, 0, 0.255) = (0.103, -0.019, 0, 0, 0.147, 0, 0.15)$.

The entries with indices 0, 3, 5 are the largest ones in this vector, and the vector $(w_0, \ldots, w_5)$ is therefore equal to (1, 0, 0, 1, 0, 1). Since $(w_4 \& \neg w_5) = (0 \& 0) = 0$, we have $x[0]=1$, $x[1]=0$, $x[2]=0$, $x[3]=1$. In total, we therefore obtain $(x[0], \ldots, x[7]) = (1, 0, 0, 1, 1, 1, 0, 0)$ which is indeed equal to the original bit vector.

Compared to traditional storage of bits on a DRAM, this voltage code has the advantage of higher density. Compared to storage of bits using conventional multilevel DRAM, this encoding technique may have an additional advantage that no external reference is necessary to compare the level of each cell against: in traditional multilevel DRAMs the capacitance of a cell is sensed, converted into a voltage, and then measured against several external references that are pre-charged to the various threshold values of the DRAM. The preparation of the external signals is often rather difficult. In contrast, with the voltage code described in this section, and more generally with all the voltage codes described in this disclosure, there is no need to for an external reference as can be seen in the decoding process described above: in the embodiment of this particular voltage code only the positions of the three largest charges of cells in a group have to be identified; in particular, there is no comparison is needed against a reference.

Example of a Voltage Code of Rate 1.5

In another embodiment, the storage device employs a voltage code in which the vectors have length 4, and which has 64 elements, thereby allowing the storage of 6 bits into 4 cells. The rate of this voltage code is thus 6/4=1.5.

The elements of this voltage code comprise vectors of the form $(a_0, \ldots, a_3) + (b_0, \ldots, b_3)$ wherein $(a_0, \ldots, a_3)$ is a permutation of the vector (0, 0, ⅑, ⅔) and $(b_0, \ldots, b_3)$ is a permutation of the vector (0, 0, ⅓, ⅔). The factors ⅑, ⅔, ⅓, ⅔ in the scheme presented here are only for illustrative purposes, and may not be optimal. They can be optimized depending on the parameters of the random variable in Equation 1.

There are 12 vectors of each kind, leading to 144 codewords. To choose 64 of them, we may proceed as follows: all the memory cells may first be reset to have zero charge. Thereafter, given the vector $(x[0], \ldots, x[5])$, we inject a charge of ⅔ into the cell with index $x[0]+2*x[1]$, a charge of ⅑ into the cell with index $(x[0]\hat{\ }x[2])+2*(x[1]\hat{\ }\neg x[2])$, add a charge of ⅔ into the cell with index $x[3]+2*x[4]$, and add a charge of ⅓ into the cell with index $(x[3]\hat{\ }x[5])+2*(x[4]\hat{\ }\neg[5])$. For example, where $(x[0], \ldots, x[5])$ is equal to (1, 0, 1, 1, 1, 0), the charge of cell with index 0 will be 0, the charge of the cell with index 1 will be ⅔+⅓=⅝, the charge of cell with index 2 will be ⅑, and the charge of the cell with index 3 will be ⅔. The voltage codeword written to the cells is thus equal to (0, ⅝, ⅑, ⅔).

An embodiment of the decoding process for this voltage code is implemented by the decoding circuitry (for example, of storage data read/decoder circuitry 408 in FIG. 4A). When reading the word $(c_0, \ldots, c_3)$, we may start by determining the position k of the largest entry, and the position l of the second largest entry. We write k as $x[3]+2*x[4]$, thereby determining $x[3]$, $x[4]$. Next, $x[5]$ is determined as $(l\hat{\ }k) \bmod 2$. We then subtract from $c_k$ the value $2\beta/3$ and from $c_l$ the value $\beta/3$ wherein $\beta$ may be chosen according to the random variable in Equation 1. For example, $\beta$ could be the mean of this random variable when a certain value is chosen for t. This value may correspond to the refresh time used for refreshing the entries of the DRAM according to this voltage code. For the new vector $(c_0, \ldots, c_3)$ we may determine again the position m of the largest entry, and the position n of the second largest entry. $x[0]$ and $x[1]$ are then determined as $m=x[0]+2*x[1]$, and $x[2]$ may be determined as $(m\hat{\ }n) \bmod 2$.

An example is provided by the voltage codeword (0, ⅝, ⅑, ⅔) above. Using Equation 1 above to model the leakage of the individual cells, and picking for the mean and the standard deviation of the random variable X the values 0.3 and 0.03, for the time t the value of 0.04 seconds (40 milliseconds), and for the parameter α the value 0.5, then the vector read after 0.04 seconds may have been changed to the vector $(c_0, c_1, c_2, c_3) = (0, 0.276, 0.0574, 0.356)$.

The largest entry of this vector is at position $k=3=1+2*1$, and the second largest entry is at position $l=1=1+2*0$. We obtain $x[3]=x[4]=1$. Furthermore, $(l\hat{\ }k)=2$, so $(l\hat{\ }k) \bmod 2=0$. This means that $x[5]=0$.

Here we may choose for $\beta$ the average value of the random variable in Equation 1 after 0.04 seconds which may be calculated to be approximately equal to 0.51. We therefore subtract from the vector $(c_0, c_1, c_2, c_3)$ the vector $(0, 0.51/3, 0, 2*0.51/3) = (0, 0.17, 0, 0.34)$ and obtain the vector (0, 0.106, 0.0574, 0.016). The largest entry of this vector is at position $m=1=1+2*0$, and the second largest entry is at position $n=2=0+2*1$. We therefore obtain $x[0]=1$ and $x[1]=0$. Furthermore, $(m\hat{\ }n)=3$, so $x[2]=(m\hat{\ }n) \bmod 2=1$. In total, the bit sequence obtained is (1, 0, 1, 1, 1, 0) which coincides with the original bit sequence.

Compared to traditional storage of bits on a DRAM, this voltage code has the advantage of higher density. As with the previous exemplary embodiment, compared to storage of bits using conventional multilevel DRAM, this encoding technique may have an additional advantage that no external reference is required to compare the level of each cell against: in traditional multilevel DRAMs the capacitance of a cell is sensed, converted into a voltage, and then measured against several external references that are pre-charged to the various threshold values of the DRAM. The preparation of the external signals is often rather difficult. In contrast, with the voltage code described in this section, and more generally with all the voltage codes described in this disclosure, there is no need to for an external reference as can be seen in the decoding process described above: in the embodiment of this particular voltage code only the positions of the three largest charges of cells in a group have to be identified; in particular, there is no comparison is needed against a reference.

Example of a Voltage Code of Rate 1.75

The previous exemplary embodiments can be extended to a voltage code in which the vectors have length 4, and which has 128 elements, thereby allowing the storage of 7 bits into 4 cells. As such, in another embodiment, the storage device may employ a voltage code rate of 7/4=1.75.

As in the previous embodiment, the elements of this voltage code comprise vectors of the form $(a_0, \ldots, a_3)+(b_0, \ldots, b_3)$ wherein $(a_0, \ldots, a_3)$ is a permutation of the vector $(0, 0, 1/3, 2/3)$ and $(b_0, \ldots, b_3)$ is a permutation of the vector $(0, 0, 1/3, 2/3)$. The factors $1/3, 2/3, 1/3, 2/3$ in the scheme presented here are only for illustrative purposes, and may not be optimal. They can be optimized depending on the parameters of the random variable in Equation 1.

There are 12 vectors of each kind, leading to 144 codewords of which we choose 128 according to the following process:

1. The charges of all four cells are initialized to zero.
2. If $x[6]=0$, then we inject a charge of $2/3$ into the cell with index $x[0]+2*x[1]$, a charge of $1/3$ into the cell with index $(x[0]\char`\^x[2])+2*(x[1]\char`\^\neg x[2])$, add a charge of $2/3$ into the cell with index $x[3]+2*x[4]$, and add a charge of $1/3$ into the cell with index $(x[3]\char`\^x[5])+2*(x[4]\char`\^\neg x[5])$.
3. If $x[6]=1$ and $x[5]=0$, then we inject a charge of $2/3$ into the cell with index $x[0]+2*x[1]$, a charge of $1/3$ into the cell with index $(\neg x[0])+2*(\neg x[1])$, add a charge of $2/3$ into the cell with index $x[3]+2*x[4]$, and add a charge of $1/3$ into the cell with index $(x[3]\char`\^x[2])+2*(x[4]\char`\^\neg x[2])$.
4. If $x[6]=1$ and $x[5]=1$, then we inject a charge of $2/3$ into the cell with index $x[0]+2*x[1]$, a charge of $1/3$ into the cell with index $(x[0]\char`\^x[2])+2*(x[1]\char`\^\neg x[2])$, add a charge of $2/3$ into the cell with index $x[3]+2*x[4]$, and add a charge of $1/3$ into the cell with index $(\neg x[3])+2*(\neg x[4])$.

For example, where $(x[0], \ldots, x[6])$ is equal to $(1, 0, 1, 1, 1, 0, 1)$, we have $x[6]=1$ and $x[5]=0$. Therefore, a charge of $2/3$ is injected into the cell with index $x[0]+2*x[1]=1$, a charge of $1/3$ into the cell with index $(\neg x[0])+2*(\neg x[1])=2$, a charge of $2/3$ is added to the cell with index $x[3]+2*x[4]=3$, and a charge of $1/3$ is added into the cell with index $(x[3]\char`\^x[2])+2*(x[4]\char`\^\neg x[2])=2$. The voltage codeword obtained is therefore $(0, 2/3, 4/3, 2/3)$.

The decoding process for this voltage code is implemented by the decoding circuitry (for example, of storage data read/decoder circuitry 408 in FIG. 4A) and is similar to the previous embodiment. As before, when reading the word $(c_0, \ldots, c_3)$, we may start by determining the position $k$ of the largest entry, and the position $l$ of the second largest entry. We then subtract from $c_k$ the value $2\beta/3$ and from $c_l$ the value $\beta/3$ wherein $\beta$ may be chosen according to the random variable in Equation 1. For example, $\beta$ could be the mean of this random variable when a certain value is chosen for $t$. This value may correspond to the refresh time used for refreshing the entries of the DRAM according to this voltage code. For the new vector $(c_0, \ldots, c_3)$ we may determine again the position $m$ of the largest entry, and the position $n$ of the second largest entry. We may write $k=z[0]+2*z[1]$, $l=u[0]+2*u[1]$, $m=w[0]+2*w[1]$, and $n=v[0]+2*v[1]$. From these we obtain $x[0]$, $x[1]$, $x[3]$, $x[4]$, and $x[6]$ directly as $$x[0]=z[0], x[1]=z[1], x[3]=w[0], x[4]=w[1],$$

$$x[6]=w[0]\char`\^w[1]\char`\^v[0]\char`\^v[1]\char`\^u[0]\char`\^u[1]\char`\^z[0]\char`\^z[1].$$

We may then proceed as follows.
1. If $x[6]=0$, then we obtain $x[2]=w[0]\char`\^u[0]$, $x[5]=z[0]\char`\^u[0]$.
2. If $x[6]=1$, then we obtain $x[5]=w[0]\char`\^w[1]\char`\^v[0]\char`\^v[1]$.
   2.1 If $x[5]=0$, then we obtain $x[2]=u[0]\char`\^z[0]$;
   2.2 If $x[5]=1$, then we obtain $x[2]=w[0]\char`\^v[0]$.

An example is provided by the voltage codeword $(0, 2/3, 4/3, 2/3)$ above. Using Equation 1 above to model the leakage of the individual cells, and picking for the mean and the standard deviation of the random variable X the values 0.3 and 0.03, for the time t the value of 0.04 seconds (40 milliseconds), and for the parameter $\alpha$ the value 0.5, then the vector read after 0.04 seconds may have been changed to the vector $$(c_0, c_1, c_2, c_3)=(0, 0.11, 0.23, 0.356).$$

The largest entry of this vector is at position $k=3=1+2*1$, and the second largest entry is at position $l=2=0+2*1$. Here we may choose for $\beta$ the average value of the random variable in Equation 1 after 0.04 seconds which may be calculated to be approximately equal to 0.51. Subtracting the vector $(0, 0, 0.17, 0.34)$ from $(c_0, c_1, c_2, c_3)$ we obtain the vector $(0, 0.11, 0.06, 0.016)$. The largest entry of this vector is at position $m=1=1+2*0$, and the second largest is at position $n=2=0+2*1$. We therefore have $$z[0]=1, z[1]=1, u[0]=0, u[1]=1, w[0]=1, w[1]=0, v[0]=0, v[1]=1.$$

It follows that $$x[0]=1, x[1]=0, x[3]=1, x[4]=1, x[6]=1.$$

Further, $x[5]=w[0]\char`\^w[1]\char`\^v[0]\char`\^v[1]=0$. In this embodiment, $x[2]=u[0]\char`\^z[0]=1$. The final bit sequence is therefore $(1, 0, 1, 1, 1, 0, 1)$ which is equal to the original bit sequence.

Compared to the previous embodiments, this voltage code provides a higher density.

Permutation Modulation Codes

In another embodiment, the device may employ a class of voltage codes which are related to permutation modulation codes and will be referred to as "voltage PM codes" hereinafter. Thus, in these embodiments, the encoder circuitry and decoder circuitry implement one or more voltage PM codes to encode the storage data and decode the encoded storage data, respectively.

Notably, voltage PM codes have several advantages over other types voltage codes. For example, they don't require an absolute reference to determine the values of the bits stored in the memory cells. As such, in certain embodiments implementing voltage PM codes, the device may employ a higher refresh cycle and to lowering the overall energy consumption of the device using such a PM code. Moreover, some voltage PM codes exhibit a large rate, leading to a higher storage density than a conventional DRAM.

In applications, a voltage PM code is a PM code in which the codewords are permutations of a fixed vector $a=(x_0, x_1, \ldots, x_{k-1})$. This vector is called the "generator" of the voltage PM code. The voltage code is called q-ary if the number of distinct elements of the vector $a$ is $q$.

Briefly, by way of background, conventional binary voltage PM code may employ the set $\{(0, 1), (1, 0)\}$ which is a full voltage PM code with generator $(0, 1)$. In one embodiment, the code is used by storing the values of a codeword on two adjacent cells. The decoder circuitry may calculate the difference between the voltage levels of the two cells; if the difference is positive, the bit may be regarded as 1, whereas in the other case the bit may be regarded as 0. An advantage of the use of this type of code is increased reliability of the cells: even when the cell which contains the one discharges heavily, as long as the difference between the cells can be detected, the stored value can be read reliably. A disadvantage of this type of coding is the obvious decrease in the storage density since two cells are needed to store one bit. The density is thus decreased by 50%. Such a method is, for example, disclosed in F errant.

Other binary voltage PM codes can be constructed starting from the binary voltage PM code using the concept of constant weight codes. In this embodiment, the generator of the code (storage data encoder circuitry) is binary, and we may assume that the entries are 0 or 1. For example, the binary voltage PM code may be generated by the vector (1, 1, 1, 0, 0, 0). As is clear to those of moderate skill in combinatorics, this code has 20 elements. An encoder for this code could take 4 bits $x[0], x[1], x[2], x[3]$. The goal would be to compute a bit vector $(a_0, \ldots, a_5)$. In a first step, we calculate the quantities A, B, C, given as $$A = x[0]\hat{\ }x[1]\hat{\ }x[2]\hat{\ }x[3]$$

$$B = (x[0]\&x[1])\hat{\ }(x[2]\&x[3])\hat{\ }((x[0]\hat{\ }x[1])\&(x[2]\hat{\ }x[3]))$$

$$C = x[0]\&x[1]\&x[2]\&x[3]$$

where $\hat{\ }$ denotes the XOR operation, and & is the logical AND. If C=0 and (A, B) is not (0, 0), then we set the vector $(a_0, \ldots, a_5)$ to $(x[0], x[1], x[2], x[3], \neg B, NAND(A, B))$, where $\neg B$ is the negation of B, and NAND(A, B) is the NAND of A and B, i.e., $\neg (A\&B)$. If A=B=C=0, then we set $(a_0, \ldots, a_5)$ to (1, 1, 0, 0, 1, 0). Otherwise, A=B=0 and C=1. In this embodiment we set $(a_0, \ldots, a_5)$ to (1, 0, 1, 0, 1, 0). The decoding process for this voltage code is implemented by the decoding circuitry (for example, of storage data read/decoder circuitry 408 in FIG. 4A). In this regard, when reading the word $(c_0, \ldots, c_5)$, we may start by determining the positions of the three largest entries. If these positions are denoted by j, k, l, then these positions may determine a vector $(v_0, \ldots, v_5)$ wherein $v_j = v_k$  $v_l = 1$, and the other entries are zero. If $(v_4 \& \neg v_5) = 1$, then $x[0] = x[5] = x[6] = x[7] = v_2$, and otherwise $441 = v_0, 451 = v_1, 461 = v_2,$ and $471 = v_3$. The determination of the largest three positions can be done in a number of ways. For example, an embodiment may use 15 comparators to compare the values of every ordered pair of positions; these comparisons can easily determine the positions of the largest values.

This voltage PM code has similar advantages as the conventional binary voltage PM code mentioned above: the cells can decay for a much longer time than for a normal DRAM since comparison of the levels of each cell is not to the fixed reference of $V_{dd}/2$; in fact, as long as the values of the cells that are originally equal to 1 are such that the corresponding positions can be determined to contain the largest positions, the decoding process will be successful. As an example, we may suppose that the cells decay according to the process given in Eq. (A) wherein the random variable X may have a mean of 0.19 and a variance of 0.01. Moreover, we assume that the parameter $\alpha$ equals 0.5. These parameters are only examples used for illustrative purposes and no claim is made as to their accuracy in a real process. Similar results as reported below may hold when other numbers are used for the mean and the variance. To fix the example further, we may suppose that the comparators used have a sensitivity of 20 mV. In a normal DRAM, there will be a cell error if the charge of the cell falls below a value of $V_{dd}/2 + 20$ mV. Assuming that $V_{dd} = 1$V, the probability that this happens is the same as the probability that the value of a zero-mean normal random variable with standard deviation 1 is below $(-\sqrt{t}/\ln(0.52) - 0.19)/0.01$.

To achieve a cell bit error rate of 1e-15, for example, would need a refresh time t of 0.00523 seconds for a standard DRAM. In contrast, for the DRAM implementing a conventional binary voltage PM code, the error probability is equal to the probability that the value of 1 decays to below 20 mV, which means that the error probability is the probability that a zero-mean normal random variable with standard deviation 1 is below $(-\sqrt{t}/\ln(0.02) - 0.19)/0.01$. To have this probability, called q in the following, below 1e-15 requires a refresh rate of t=0.1872 seconds which is more than 35 times larger than for a standard DRAM. The error probability of the voltage PM code above is $1-(1-q)^3$. To have it below 1e-15 requires a refresh rate t of 0.1827 seconds. If there is an error, then at least one bit in a group of 4 bits will be in error. To have a fair comparison between these codes, we could ask to have groups of 4 bits intact with probability at least 1-1e-15. In this embodiment, we could achieve this with a refresh rate of t=0.1827 seconds for the above voltage PM code, we could achieve this with a refresh rate of t=0.1815 for the voltage code of conventional binary voltage PM code, and we could achieve this with a refresh rate of 0.00507 for the standard DRAM. Therefore, in terms of refresh time the above voltage code has the best value (even better than the code of the conventional binary voltage PM code discussed above) whereas its density is 66% of that of the standard DRAM, i.e., 33% more than the density of the code of such conventional binary voltage PM code.

Very similar results hold if the generator is chosen to be [1, 1, 1, 1, 0, 0, 0, 0]. In this embodiment it is possible to store 6 bits on 8 cells. This code stores 6 bits in 8 cells, hence its density is 75% that of a standard DRAM, and 50% more than that of the aforementioned conventional binary voltage PM code. The refresh time for this code is also more than 35 times larger than that of a standard DRAM.

Embodiments Implementing PM-Type Voltage Codes

As mentioned above, the storage devices may employ voltage PM codes wherein the encoder circuitry and decoder circuitry implement one or more voltage PM codes to encode the storage data and decode the encoded storage data, respectively. In one embodiment, the storage devices employ an n-ary voltage PM code used for storage on volatile memory. Briefly, the input to this procedure of this exemplary embodiment is a target error rate E, the mean $\mu$ and the variance $\sigma$ of the probability distribution in Eq. (A), the parameters a of the distribution, integers $l_0, \ldots, l_{n-1}$, a refresh time t and a sensitivity v. The procedure tries to find values $x_0, \ldots, x_{n-2}$ such that for a voltage code with generator $$a = \underbrace{(x_0, \ldots, x_0}_{l_o} | \underbrace{x_1, \ldots, x_1}_{l_1} | \ldots | \underbrace{x_{n-1}, \ldots, x_{n-1})}_{l_{n-1}}$$

wherein the first group has $l_0$ elements, and the last group has $l_{n-1}$ elements. The entries of this vector are between 0 and 1, and the last $l_{n-1}$ entries are all zero. A permutation of this vector is used to store the values on N cells wherein $N = l_0 + \ldots + l_{n-1}$. The stored values are denoted by $l_0, \ldots, l_{n-1}$. After a time t has elapsed, the values that are read from the cells will be $$y_0 e^{-t^\alpha/X_0}, \ldots, y_{N-1} e^{-t^\alpha/X_{N-1}}.$$

An error is made if there are two indices i and j such that $y_i > y_j$ but $y_i e^{-t^\alpha/X_i} < v + y_j e^{-t^\alpha/X_j}$. The values of $x_0, x_1, \ldots, x_{n-1}$ are calculated to make the total error less than E.

As mentioned above, the value of $x_{n-1}$ is set to zero.

Thereafter, the value of $x_{n-2}$ is calculated in such a way that $$l_{N-2} Pr[x_{n-2} e^{-t^\alpha/X} < v] = \frac{\epsilon}{n-1}$$

wherein X is a normal Gaussian random variable with mean $\mu$ and variance $\sigma$ and Pr denotes the probability. This is easily seen to be equivalent to $$l_{n-2}(1 - Q_\sigma(-t^\alpha/\ln(v/x_{n-2}) - \mu)) = \frac{\epsilon}{n-1}$$

where $$Q_\sigma(x) = \frac{1}{\sqrt{2\pi\sigma^2}} \int_{-\infty}^{x} e^{-(s-\mu)^2/2\sigma^2} ds.$$

This means that the value of $x_{n-2}$ is calculated as $$x_{n-2} = v e^{\mu + Q_\sigma^{-1}\left(1 - \frac{\epsilon}{(n-1)l_{n-2}}\right)}.$$

Next the value of $x_{n-3}$ is calculated in such a way as to establish $$l_{n-3}l_{n-2} Pr[x_{n-3} e^{-t^\alpha/X} < v + x_{n-2} e^{-t^\alpha/Y}] = \frac{\epsilon}{n-1}$$

wherein X and Y are independent Gaussian random variables with mean $\mu$ and variance $\sigma$. This probability is an upper bound on the probability that any of the $l_{n-3}$ entries in group n-3 of the vector a becomes smaller than any of the $l_{n-2}$ entries in group n-2 of a. The last equation can be relaxed to the following equation $$l_{n-3}l_{n-2}\left(1 - \int_0^1 Q_\sigma\left(-\mu - t^\alpha/\ln\left((v + x_{n-2}e^{-t^\alpha/Q_\sigma^{-1}(1-s)})/x_{n-3}\right)\right)ds\right) = \frac{\epsilon}{n-1}.$$

The value of $x_{n-3}$ can be calculated from this.

The procedure continues in a similar fashion to compute the values of x, for all i from n-4 down to 0. If the value of $x_{i+1}$ is known, that of $x_i$ is obtained from the equation $$l_i l_{i+1}\left(1 - \int_0^1 Q_\sigma\left(-\mu - t^\alpha/\ln\left((v + x_{i+1}e^{-t^\alpha/Q_\sigma^{-1}(1-s)})/x_i\right)\right)ds\right) = \frac{\epsilon}{n-1}.$$

Exemplary Voltage PM Codes

In the exemplary coding techniques (which are employed by the encoder circuitry and decoder circuitry) described below, we choose $\epsilon=10^{-15}$, $\mu=0.19$, $\sigma=0.01$, $\alpha=0.5$. The refresh time $\tau$ for a standard DRAM with these settings is 0.005229 seconds, as was shown above. The refresh time needed for the DRAM using the voltage PM codes given below is given as a multiple r of $\tau$, i.e., $t=r\tau$.

The parameters employed here are only for illustrative purposes. Other values for these parameters can be chosen and similar results can be obtained. All parameters consistent with this description may be employed and, as such, the coding techniques resulting therefrom are intended to fall within the scope of the present inventions. The various embodiments are identified by the number of bits stored in a cell group and the number of cells in the group. Thus, 8B6C identifies an embodiment storing eight bits in a six cell memory group.

8B6C: In this embodiment, the generator a is of the form a=(x, y, z, u, 0, 0), wherein the parameters x, y, z, u are distinct and may be determined in such a way as to optimize the code with respect to some cost function. For example, where the cost function is the refresh time needed, and the objective is to maximize this time, a may be chosen as a=(0.992371, 0.491736, 0.223515, 0.07643, 0, 0). In this embodiment r=4.15, which means that the refresh time for the corresponding DRAM will be 4.15 times larger than that of a standard DRAM. There are 360 different permutations of the vector a, so 8 bits can be encoded into this codebook. The bits can be encoded into a permutation in a variety of ways. For example, in one embodiment, a table lookup can be used. In another embodiment, circuitry that encodes/decodes a byte into a permutation may be employed in the encoder circuitry and decoder circuitry. Other variations or embodiments may also be employed.

The density of this design is 8/6=1.33, which means that with this design the density is improved by 33% while the refresh time is increased by a factor of 4.15. Since during this refresh time 1.33 times more cells are refreshed, the amount of energy used by the refresh operation is in fact 4.15*4/3 times less, i.e., the refresh energy used is 5.533 times less than that of a standard DRAM.

8B8C: In this embodiment the generator a is of the form a=(x, x, y, y, 0, 0, 0, 0), wherein the parameters x, y are distinct and may be determined in such a way as to optimize the code with respect to some cost function. For example, where the cost function is the refresh time needed, and the objective is to maximize this time, a may be chosen as a=(0.976712, 0.976712, 0.234784, 0.234784, 0, 0, 0, 0). In this embodiment r=14, which means that the refresh time for the corresponding DRAM will be 14 times larger than that of a standard DRAM. There are 420 different permutations of the vector a. 8 bits can be encoded into this codebook using for example the methods taught in Cronie-2. This means that the density of this voltage code DRAM is the same of that of a standard DRAM while its refresh time is 14 times larger.

15B10C: In this embodiment the generator a is of the form a=(x, y, z, z, z, u, u, u, 0, 0), wherein the parameters x, y, z, u are distinct and may be determined in such a way as to optimize the code with respect to some cost function. For example, where the cost function is the refresh time needed, and the objective is to maximize this time, a may be chosen as a=(0.984720, 0.491025, 0.222455, 0.222455, 0.222455, 0.075221, 0.075221, 0.075221, 0, 0). In this embodiment r=4.05, which means that the refresh time for the corresponding DRAM will be 4.05 times larger than that of a standard DRAM. There are 50400 different permutations of this vector which means that we can encode 15 bits into the corresponding codebook. In one embodiment, for example, a table lookup is executed in conjunction with methods disclosed in Cronie-2. This means that the density of the voltage code DRAM is 50% more than that of a standard DRAM while its refresh time is more than 4 times larger. Since during this refresh time 1.5 times more cells are refreshed, the amount of energy used by the refresh operation is in fact 4.05*1.5 times less, i.e., the refresh energy used is 6.075 times less than that of a standard DRAM while the density is 50% larger.

18B10C: In this embodiment the generator a is of the form a=(x, y, z, u, w, w, t, t, 0, 0), wherein the parameters x, y, z, u, w, t are distinct and may be determined in such a way as to optimize the code with respect to some cost function. For example, where the cost function is the refresh time needed, and the objective is to maximize this time, a may be chosen as a=(0.983564, 0.629365, 0.386984, 0.225519, 0.117969, 0.117969, 0.046942, 0.046942, 0, 0). In this embodiment r=1.68, which means that the refresh time for the corresponding DRAM will be 1.68 times larger than that of a standard DRAM. There are 453600 different permutations of this vector which means that we can encode 18 bits into the corresponding codebook. This embodiment may be implemented, for example by combining a table lookup with methods disclosed in Cronie-2. This means that the density of the voltage code DRAM is 80% more than that of a standard DRAM while its refresh time is 1.68 times larger. Since during this refresh time 1.8 times more cells are refreshed, the amount of energy used by the refresh operation is in fact 1.68*1.8 times less, i.e., the refresh energy used is 3.024 times less than that of a standard DRAM while the density is 80% larger.

Exemplary High Level Architecture of Dram Elements Utilizing Voltage PM Codes

Figure 6:
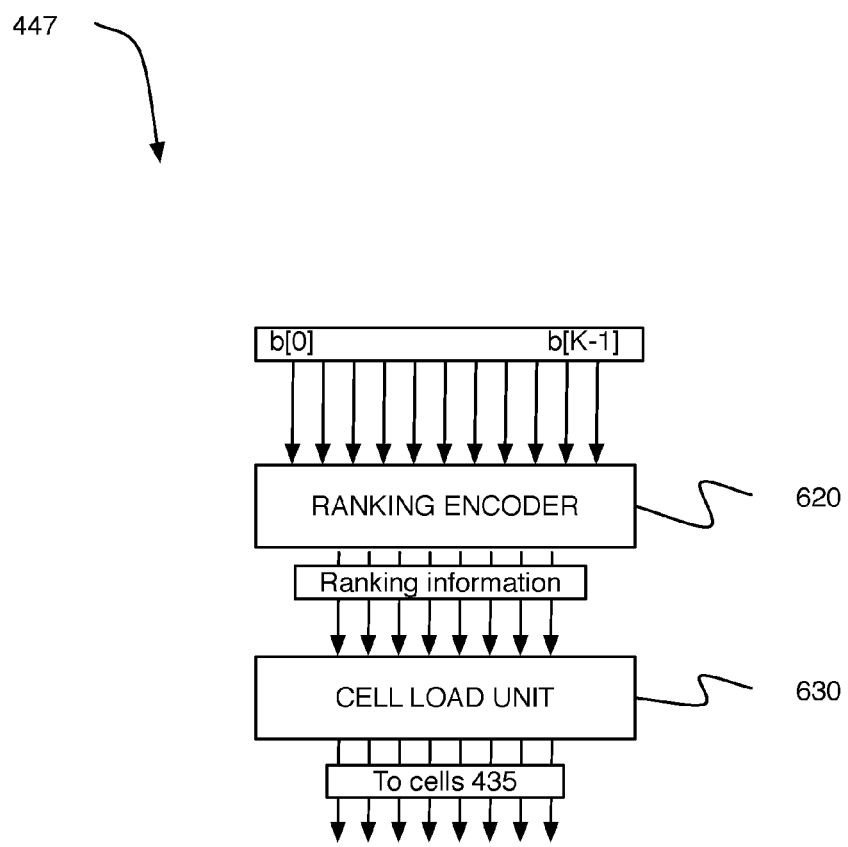
FIG. 6 is a block diagram of an encoder for storing data in a group of memory cells.
Figure 7:
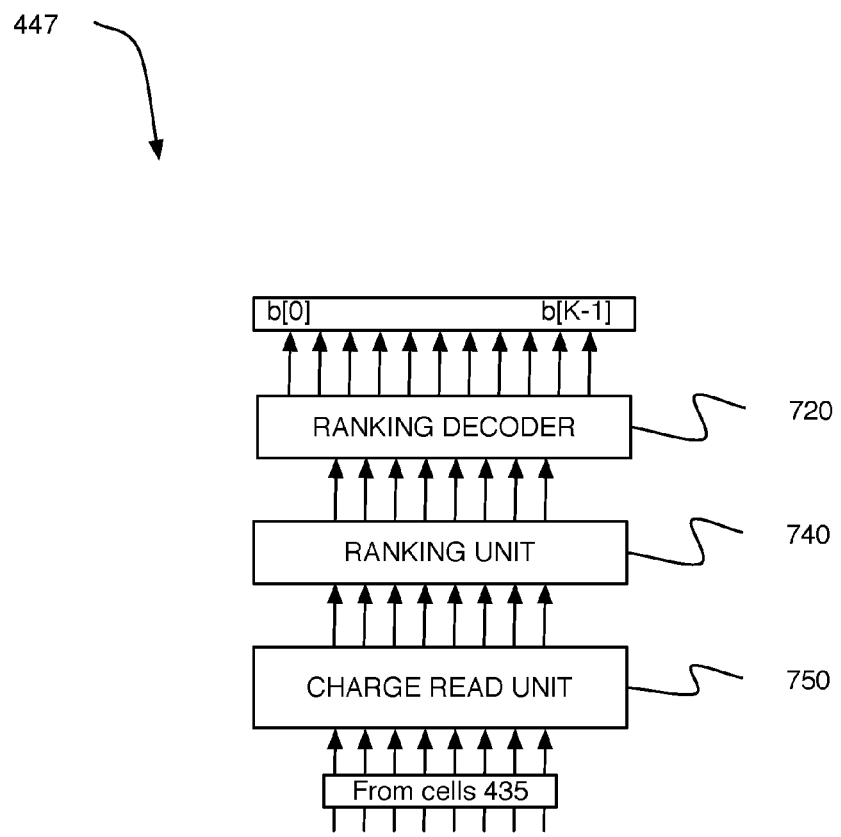
FIG. 7 is a block diagram of a decoder for reading data from a group of memory cells.

An exemplary high level architecture of the Write/Read circuits of 447 of FIGS. 4A and 4B is now given with reference to FIG. 6 and FIG. 7 for the embodiments where a voltage PM code is employed in the encoder and decoder circuitry. Specifically, in FIG. 6, the bits b[0], . . . , b[K−1] to be stored are given to a ranking encoder circuit 620. A task of ranking encoder circuit 620 is to produce ranking information. In operation, where the code generator a equals a= $(x_0, x_1, \ldots, x_{k-1})$, where $x_0 \geq x_1 \geq \ldots \geq x_{k-1}$ and $x_m = x_{m+1} = \ldots = x_{k-1} = 0$, the ranking information may be operationally equivalent to a vector v=(v[0], v[k−m−]) which may mean that cells with indices v[i] will have charge equivalent to $x_1$ for i=0, . . . , k−m−1, while all the other cells have charge 0. This vector may be used to the cell load circuit 630 to put the charges into the corresponding cells 435 of FIGS. 4A and 4B.

FIG. 7 shows an exemplary architecture of a read circuit when voltage PM codes are used. Specifically, charges from the cells 435 of FIGS. 4A and 4B are read by a charge read circuit 750. These charges may be translated by this circuit into other physical quantities, such as voltages, and these quantities are forwarded in form of a vector to a ranking circuit 740. Where the vector forwarded to the ranking circuit is $(x_0, x_1, \ldots, x_{k-1})$, where the j-th entry of this vector is a description of the charge level of the j-th cell, the output of the ranking circuit may be a permutation $\pi=(\pi(0), \ldots, \pi(k-1))$ of the integers 0, 1, . . . , k−1 such that $x_{\pi(0)} \geq x_{\pi(1)} \geq \ldots \geq x_{\pi(k-1)}$, meaning that the cell with index $\pi(0)$ has the largest charge, the cell with index $\pi(1)$ has the second largest charge, etc.

Notably, where the 8B8C code introduced above is used, the positions of the cells with the two largest values, and the positions of the cells with the two second largest values may be sufficient to decode the codeword. After the ranking circuit 740 has created its output, this output is forwarded to a ranking decoder 720 which uses the output of the ranking circuit to produce the bits b[0], . . . , b[K−1]. Some examples of these circuits will be provided later.

Figure 8:
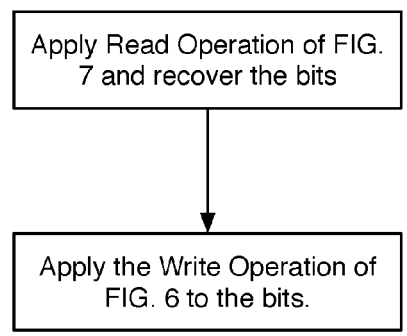
FIG. 8 is a flow chart for a memory refresh operation.

Using the write and read circuits of FIG. 6 and FIG. 7, it is also possible to describe a possible refresh operation for a DRAM using voltage PM codes. This is done with reference to FIG. 8. In this embodiment, the read operation of FIG. 7 is applied to recover the storage data bits stored in a group of cells 435, and then these bits are used by the write circuit of FIG. 6 to store the corresponding charges back into the memory cells of the memory area.

Notably, in those embodiments where the encoder and/or decoder circuitry employ ranking and/or sorting techniques, the encoder and/or decoder circuitry may implement any or all of the circuitry and techniques described in Cronie-3.

Exemplary Operation of Ranking Encoder and Ranking Decoder

Figure 9:
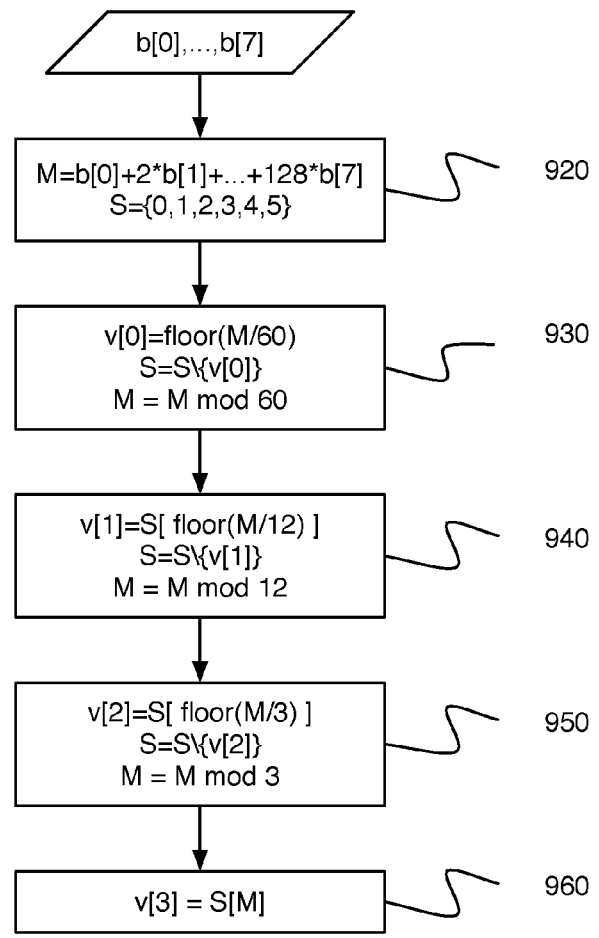
FIG. 9 is a flow chart for a rank encoder operation.

For the code 8B6C given above, the generator a is of the form a=(x, y, z, u, 0, 0) wherein x, y, z, u are distinct. One embodiment of a possible ranking encoder 620 of FIG. 6 is now described with reference to FIG. 9. The input to this module are 8 bits b[0], . . . , b[7], and the output is a vector v=(v[0], v[1], v[2], v[3]) of integers in {0, 1, 2, 3, 4, 5}. Operationally, this may mean that the cell load circuit 630 needs to put a charge of x on the cell with index v[0], a charge of y on the cell with index v[1], a charge of z on the cell with index v[2], and a charge of u on the cell with index v[3]. A flowchart of an exemplary process employed by the ranking encoder circuit is given in FIG. 9. Specifically, in Step 920 an integer M is calculated whose binary expansion if b[0], . . . , b[7], and a set S is initialized to {0, 1, 2, 3, 4, 5}. It is understood that the set S comes with an ordering of its elements from lowest to largest. Thereafter, in Step 930 the value of v[0] is calculated as floor(M/60), wherein floor(x) for a real number x is the smallest integer less than or equal to x. So, for example, floor(1.2)=1, and floor(2.34)=2. The element v[0] is removed from the set S, and the value of M is updated to M mod 60, i.e., the remainder of M after division by 60. In Step 940 the second entry v[1] of the vector v is calculated as S[floor(M/12)], the element v[1] is removed from S, and the value of M is updated to M mod 12. In Step 950 the third entry v[2] of the vector v is calculated as S[floor(M/3)], the element v[2] is removed from S, and the value of M is updated to M mod 3. In Step 960 the final value v[3] of v is calculated as SM.

As will be clear to those of moderate skill in the art, the values v[0], . . . , v[3] will always be distinct, and will be integers in the set {0, 1, 2, 3, 4, 5}.

An example is now provided for the embodiment where the input vector is (b[0], . . . , b[7])=(0, 1, 1, 0, 1, 1, 0, 1). In this embodiment, the number M is calculated in Step 920 as M=182 and S is initialized to {0, 1, 2, 3, 4, 5}. In Step 930 v[0] is calculated as floor(182/60)=3, and S becomes {0, 1, 2, 4, 5}. Moreover, M becomes M mod 60=2. Since floor(M/12)=0, the value of v[1] is calculated to be S[0]=0 in Step 940, S is updated to {1, 2, 4, 5}, and M is updated to M mod 12=2. The value of v[2] is computed as S[0]=1 in Step 950, S is updated to {2, 4, 5}, and M keeps its value 2. Finally, the value of v[3] is S[2]=5, so that (v[0], . . . , v[3])=(3, 0, 1, 5).

An exemplary operation of the ranking decoder circuit of FIG. 7 is now described. In this embodiment the ranking circuit 740 of FIG. 7 may have produced a vector $(\pi(0), \pi(1), \pi(2), \pi(3))$, which may mean that the cell with index $\pi(0)$ has the largest charge, the cell with index $\pi(1)$ has the second largest charge, etc. Upon receiving this vector, the circuit may calculate a number M as $$M = \sum_{j=0}^{3} \tau[j](\pi[j] - |\{i < j \mid \pi[i] < \pi[j]\}|),$$

where $(\tau[0], \tau[1], \tau[2], \tau[3])=(60, 12, 3, 1)$. Thereafter, the bits b[0], . . . , b[7] may be obtained from the binary expansion of M: M=b[0]+b[1]+ . . . +128b[7].

As an example, consider the embodiment where the input to the ranking decoder is $(\pi[0], \pi[1], \pi[2], \pi[3])=(3, 0, 1, 5)$, i.e., the output of the ranking encoder example above. This means that the largest charge is to be put in cell with index 3, the second largest into cell with index 0, etc. From this vector we calculate the value M according to the following formula:

$j=0 \rightarrow \pi[0] - |\{i<0 \mid \pi[i]<\pi[0]\}| = \pi[0] = 3$ $j=1 \rightarrow \pi[1] - |\{i<1 \mid \pi[i]<\pi[1]\}| = \pi[1] = 0$ $j=2 \rightarrow \pi[2] - |\{i<2 \mid \pi[i]<\pi[2]\}| = \pi[2] - 1 = 0$ $j=3 \rightarrow \pi[3] - |\{i<3 \mid \pi[i]<\pi[3]\}| = \pi[3] - 3 = 2$ We therefore obtain M=3*60+0*12+0*3+2=182, from which we obtain the bits (b[0], . . . , b[7])=(0, 1, 1, 0, 1, 1, 0, 1) through binary expansion.

Full Voltage PM Codes and Exemplary Procedures of the Ranking Encoder and Ranking Decoder A "full voltage PM code" is a voltage PM code in which the coordinates of the generator a are all distinct. As is clear to those of skill in the art, among all possible voltage PM codes of length k, the rate of a full voltage PM code is the largest possible. Moreover, a full voltage PM code of length n is necessarily n-ary.

We describe the operation of the ranking encoder circuit 620 and the ranking decoder circuit 720 for full voltage PM codes. For ease of presentation we will assume that the length of the generator (and the number of cells) is a power of 2: $K=k=2^m$.

The input of the ranking encoder process is a vector b=(b[0], . . . , b[N−1]) where N=mK/2. So, for example, when K=8. Then N=12. The output of the ranking encoder process is a permutation ($\pi(0), \pi(1), \ldots, \pi(K-1)$) of the set {0, 1, 2, . . . , K−1}. The ranking encoder process is described by a procedure given in the pseudocode listing of FIG. 18. The Swap(.) function in the pseudocode listings exchanges or swaps its arguments.

The ranking decoder process receives a permutation ($\pi(0), \pi(1), \ldots, \pi(K-1)$) and creates N bits b[0], . . . , b[N−1] according to the process given in the pseudocode of FIG. 19, where $\pi(j+k)[i]$ is the i-th least significant bit of the integer $\pi(j+k)$.

Figure 10:
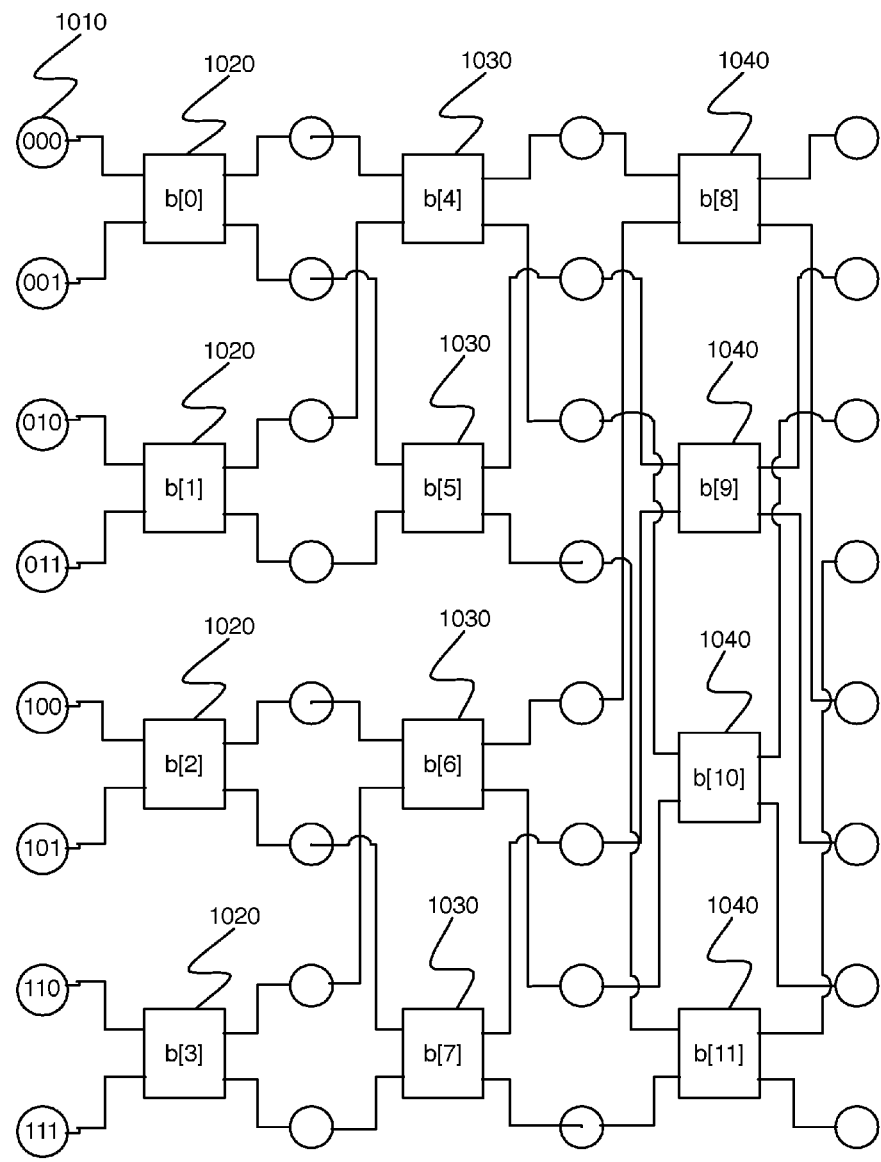
FIG. 10 is a flow chart for a rank decoder operation.11
Figure 11A:
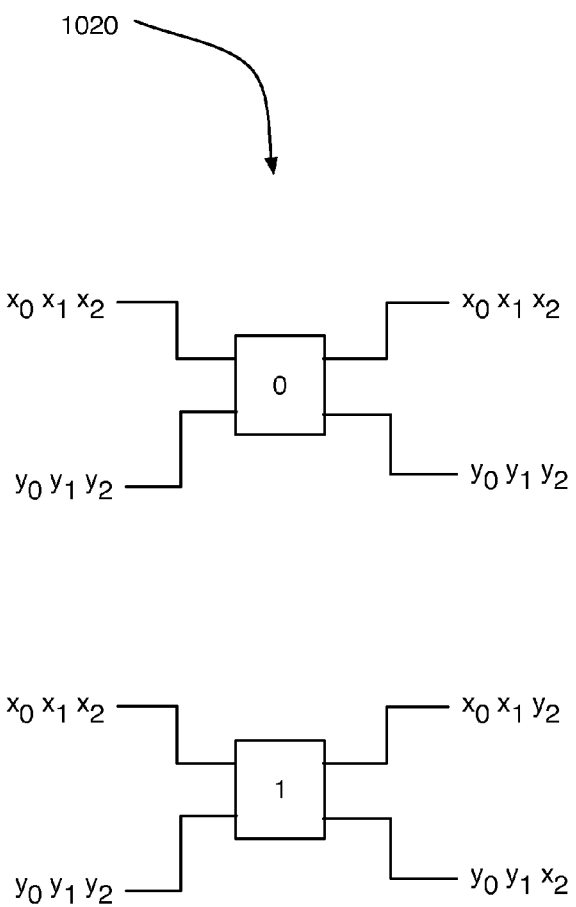
FIGS. 11A, 11B, and 11C illustrate the operation of particular SWAP circuits.

The loops given above can be optimized and unrolled for any specific value of K. One such example is given with reference to FIG. 10 and FIG. 12. Specifically, FIG. 10 describes an exemplary process for the rank encoder circuit where K=8. The circles in this figure correspond to the values of the entries of the permutation vector $\pi$. Read from top to bottom, the values in the circles will be equal to ($\pi(0), \ldots, \pi(K-1)$) at every point in the process. For example, at the beginning of the process, corresponding to the circles 1010 in the left most column, the bit representation of $\pi(0)$ is 000, that of $\pi(1)$ is 001, etc., corresponding to the initial value of the permutation being equal to (0, 1, . . . , 7). In a first level, the bits b[0], . . . , b[3] are used in conjunction with four SWAP circuits 1020 to produce a first transformation of the permutation $\eta$ given in the second column of circles. The task of the SWAP circuits 1020 is further described in FIG. 11A: they swap the least significant bits of their arguments if the corresponding bit is 1. As an example, if b[0]=b[3]=1, and b[1]=b[2]=0, then the first SWAP circuit 1020 swaps the least significant bits of its arguments 000 and 001, which means that the values of the first two circles in the second column are 001 and 000. The same is true for the last pair of value of $\pi$, so that the values of the last two circles are 111 and 110. Altogether, the entries of the second set of circles are, read from top to bottom, equal to 001, 000, 010, 011, 100, 101, 111, and 110. Note that the circuits 1020 operationally swap their arguments entirely if the corresponding bit is 1. However, they do the swap only on the least significant bit to save on the number of operations.

Figure 11B:
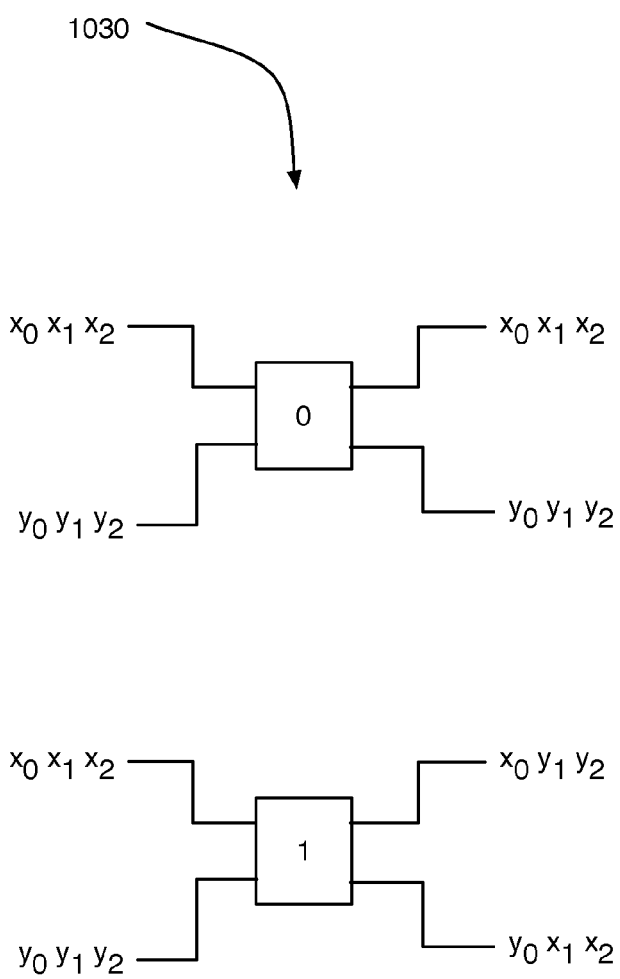

Assume now that b[4]=1, b[5]=0, b[6]=b[7]=1. The circuits 1030 described in FIG. 11B swap the two least significant bits of their arguments if the corresponding bit is 1. Therefore, the values of the circles in the third column are 010, 000, 001, 011, 111, 110, 100, 101.

Figure 11C:
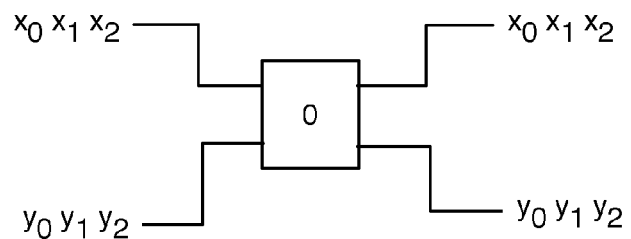
Figure 11C:
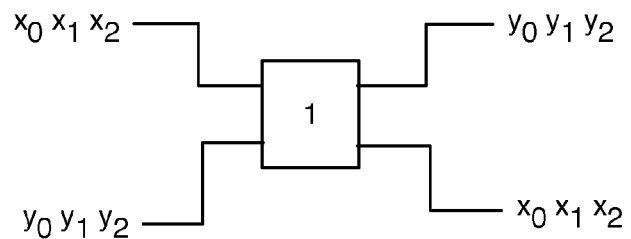
Figure 12:
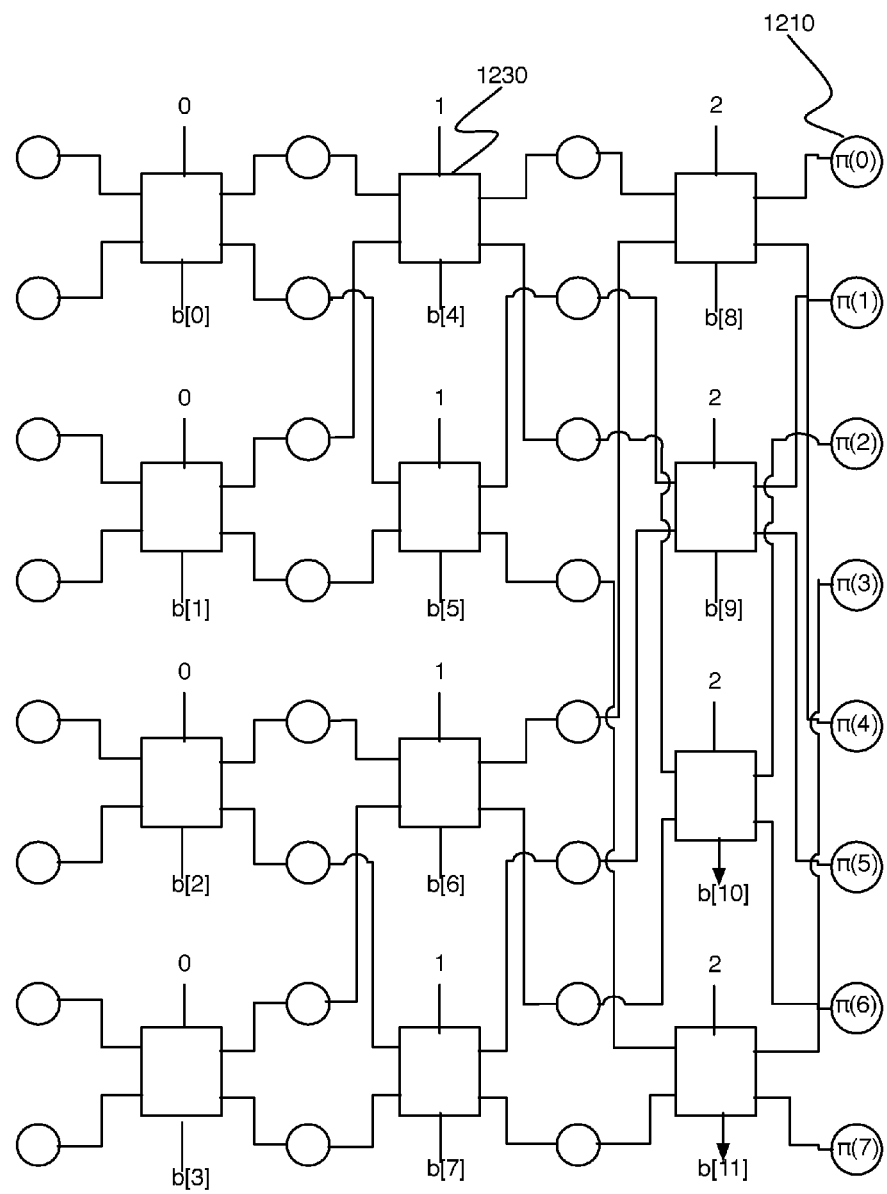
FIG. 12 is a circuit diagram showing the operation of an unrolled version of the rank decoding procedure.
Figure 13:
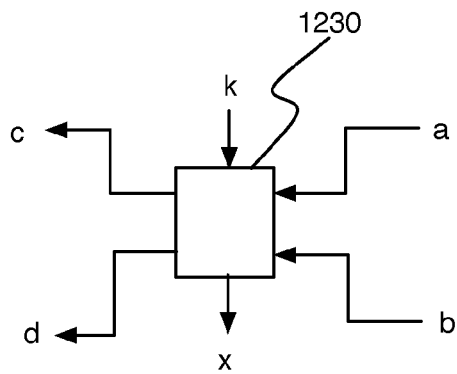
FIG. 13 shows the operation of a conditional swap circuit.

As a matter of example, assume that b[8]=b[10]=b[11]=1, and b[9]=0. The SWAP circuits 1040 described in FIG. 11C completely swap the values of their arguments. In this embodiment, the output of the rank encoder circuitry (which may be storage data encoder circuitry 404), given by the values of the last column of circles in FIG. 10, will be 111, 000, 100, 101, 010, 110, 001, 011, leading to the permutation $\pi=(7,0,4,5,2,6,1,3).$ An unrolled version of the rank decoding procedure outlined above in pseudocode is now explained for the embodiment where K=8 with reference to FIG. 12. As can be seen by the reader, this procedure is similar to the rank encoding procedure given in FIG. 10. One of the differences is, however, that while the flow of data in FIG. 10 was from left to right, the flow of data in FIG. 12 is from right to left. The input to this procedure is a permutation $\pi=(\pi(0), \ldots, \pi(7))$, given in the cells 1210 in the right most column. In general, the circles in this figure correspond to the values of the entries of the permutation vector $\pi$. Read from top to bottom, the values in the circles will be equal to ($\pi(0), \ldots, \pi(K-1)$) at every point in the process. This process also makes use of 12 conditional swap circuits 1230. Such a circuit is detailed in FIG. 13, and accepts three inputs and three outputs. Two of the inputs, given as a and b, are integers in {0, 1, 2, 3, 4, 5, 6, 7}, and one of the inputs, given as k, is an integer in {0, 1, 2}. For arbitrary values of K, the inputs a and b belong to the set {0, 1, . . . , K−1}, and the input k belongs to the set {0, 1, . . . , m−1} where $K=2^m$. The operation of the conditional swap circuit is explained in FIG. 13; Its output, x, equals the k-th least significant bit of its first input a. If this bit is zero, then its first output c equals a and its second output d is b. If this bit is one, then the inputs are swapped, i.e., the first output is b and the second output is d. Returning to FIG. 12, the conditional swap circuits reveal the bits b[0], . . . , b[11] one by one, but in reverse order, and conditionally swap the values of their first and second inputs depending on the value of these bits.

As an example, consider the permutation $\pi=(7, 0, 4, 5, 2, 6, 1, 3)$ from the previous example. They correspond to the binary representations 111, 000, 100, 101, 010, 110, 001, 011. The first condition swap circuit compares 111 and 010. Sine bit 2 of the first input 111 is 1, it swaps these inputs and reveals the value of b[8] as 1. The second conditional swap circuit compares the inputs 000 and 110. Bit 2 of the first input is 0, so b[9]=0, and the inputs are not swapped. Similarly, the third conditional swap circuit compares 100 and 001, deduces that b[10]=1, and swaps the values. The fourth conditional swap circuit compares 101 and 011, deduces b[11]=1, and swaps its inputs. Therefore, the values of the second set of circles from the right in FIG. 12, reading from top to bottom, will be 010, 000, 001, 011, 111, 110, 100, 101. To obtain the value of b[4], the corresponding conditional swap circuit compares the values of 010 and 001. Bit 1 of the first input is 1, so b[4]=1 and the inputs are swapped. In a similar manner, b[5]=0, and the inputs are not swapped, b[6]=1 and the inputs are swapped, and b[7]=1 and the inputs are swapped. The values of the third set of circles from the right, read from top to bottom, will therefore be 001, 000, 010, 011, 100, 101, 111, 110. To obtain b[0], the first two entries 001 and 000 are compared. Bit 2 of the first input is 1, so b[0]=1, and the entries are swapped. Similarly, b[1]=0 and the inputs are not swapped, b[2]=0 and the inputs are not swapped, and b[3]=1 and the inputs are swapped. The entries in the first set of circles from the left will be 000, 001, 010, 011, 100, 101, 110, 111 and the recovered bit sequence is (1, 0, 0, 1, 1, 0, 1, 1, 1, 0, 1, 1) which is equal to the original bit sequence.

It should be noted that applying lower voltages to the memory cells to store data translates to spending lower energy on charging the cells to the appropriate levels. For example, using as a proxy of the energy the square of the Euclidean norm of the generator of the voltage PM code, in conventional DRAM storage the energy would be on average ½ per cell. For the embodiments implementing the voltage PM codes in this disclosure, the energy can be substantially lower—for example, the voltage PM code 8B8C exhibits a static energy reduction/improvement of almost a factor of 4. Moreover, the codes can be optimized for static energy usage, or a combination of dynamic and static energy usage.

There are many embodiments described and illustrated herein. While certain embodiments, features, attributes and advantages have been described and illustrated, it should be understood that many others, as well as different and/or similar embodiments, features, attributes and advantages of the present invention, are apparent from the description and illustrations. As such, the above embodiments of the inventions are merely exemplary. They are not intended to be exhaustive or to limit the inventions to the precise forms, techniques, materials and/or configurations disclosed. Many modifications and variations are possible in light of this disclosure. It is to be understood that other embodiments may be utilized and operational changes may be made without departing from the scope of the present inventions. As such, the scope of the inventions is not limited solely to the description above because the description of the above embodiments has been presented for the purposes of illustration and description.

Importantly, the present inventions are neither limited to any single aspect nor embodiment, nor to any combinations and/or permutations of such aspects and/or embodiments. Moreover, each of the aspects of the present inventions, and/or embodiments thereof, may be employed alone or in combination with one or more of the other aspects and/or embodiments thereof. For the sake of brevity, many of those permutations and combinations will not be discussed and/or illustrated separately herein.

For example, in one embodiment, the voltage code implemented by the encoder circuitry to encode the storage data (and by the decoder circuitry to decode and recover the storage data) may be fixed or programmable, for example, one time programmable (for example, programmed during test or at manufacture) or more than one time programmable (for example, during test, start-up/power-up, during an initialization sequence and/or during operation of the circuitry or device (for example, in situ)).

Figure 14:
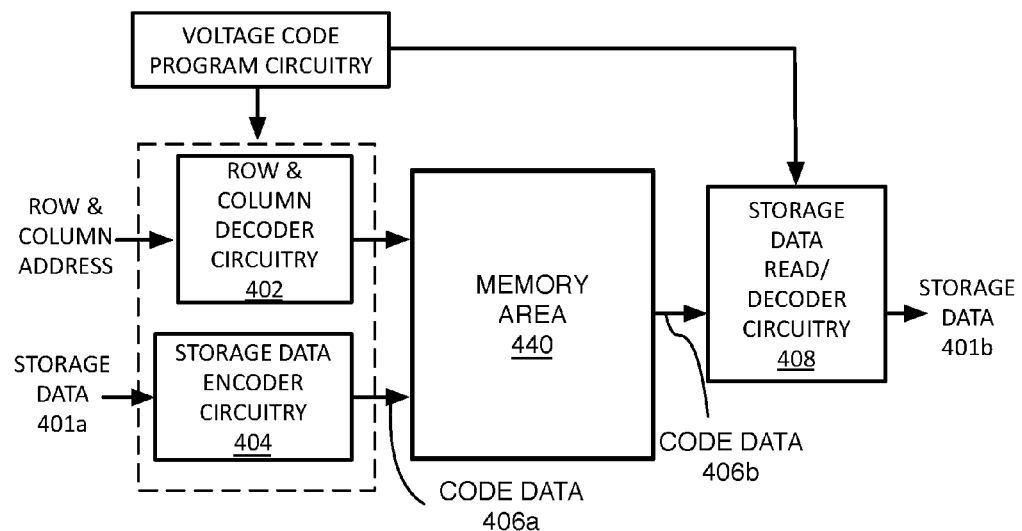
FIG. 14 shows a memory device incorporating a voltage code program circuit.

With reference to FIG. 14, in one embodiment, the device may include voltage code program circuitry to store information which is representative of the desired voltage code to be implemented by the storage data encoder circuitry and the storage data read/decoder circuitry. In one embodiment, the voltage code program circuitry includes a register or the like to store the desired voltage code to be implemented by the storage data encoder circuitry and the storage data read/decoder circuitry.

In another embodiment, the voltage code program circuitry may include fuses or anti-fuses, DRAM, SRAM, ROM, PROM, EPROM, EEPROM and/or flash memory cells, to store data which is representative of the voltage code for use by the storage data encoder circuitry and the storage data read/decoder circuitry. In one embodiment, the data which is representative of the voltage code to be implemented may be provided to the storage data encoder circuitry and the storage data read/decoder circuitry, for example, at start-up/power-up, during an initialization sequence, by external integrated circuit device and/or in response to one or more user or operator instructions or inputs. Indeed, in one embodiment, the voltage code may be determined at start-up/power-up, during an initialization sequence, by external circuitry and/or in response to user or operator instructions based on information that is representative of the output data length (for example, ×4, ×8 or ×16) and thereafter the voltage code which, for example, is most efficient for the output data length, is provided to the storage data encoder circuitry and the storage data read/decoder circuitry.

For example, where the output data length is ×4, ×8 or ×16, it may be advantageous to employ a rate of voltage code of 1.5 wherein the storage data encoder circuitry generates a codeword of length 4 from 6 bits of storage data. That is, a voltage code in which the vectors have length 4, and which has 64 elements, thereby allowing the storage of 6 bits into 4 cells. The rate of this voltage code is thus 6/4.

Notably, the memory (for example, register) may be a permanent, semi-permanent or temporary (i.e., until re-programmed) storage; for example, a DRAM, SRAM, ROM, PROM, EPROM, EEPROM and/or Flash memory cells that are resident on (i.e., integrated in) the interface circuitry, device or system, or external thereto (i.e., not integrated in). Indeed, the voltage code for the storage data encoder circuitry and the storage data read/decoder circuitry may be defined via a particular fixed configuration of the state of switch(es) or certain pin(s) on the package of the device (which may be, for example, defined or established during manufacturing). All circuitry and techniques of (i) storing scaling information and/or (ii) programming the storage data encoder circuitry and the storage data read/decoder circuitry during before or during operation are intended to fall within the scope of the present invention.

Figure 16A:
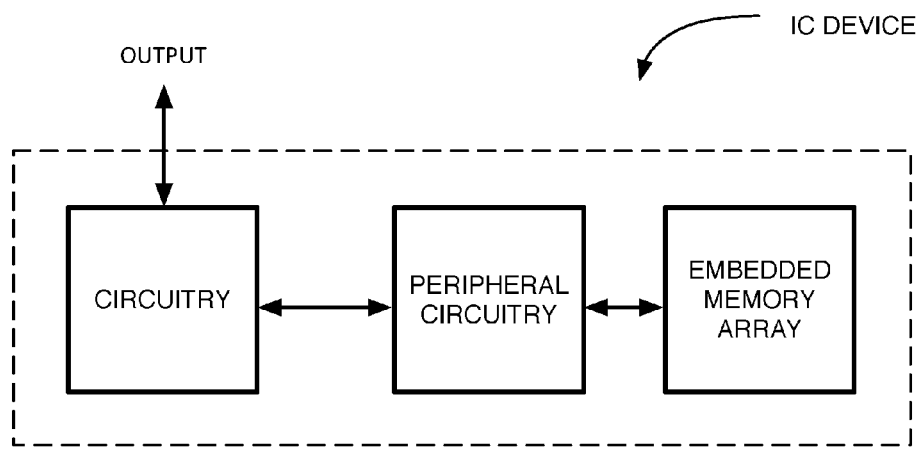
FIGS. 16A and 16B show block diagrams for embedded and discrete memory devices.
Figure 16B:
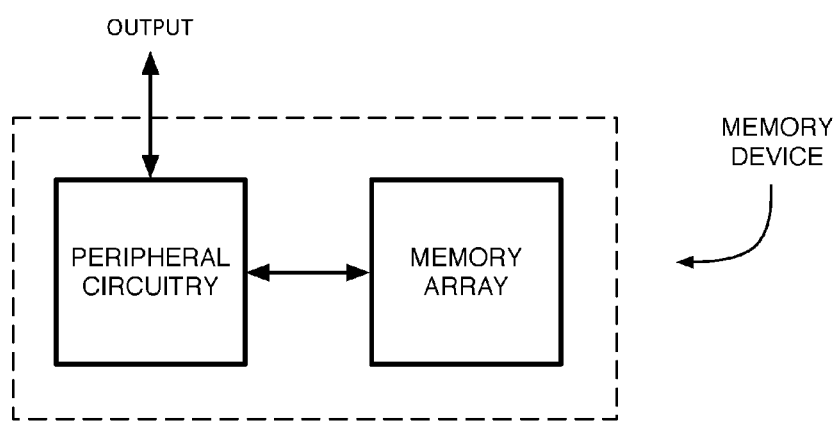
Figure 17A:
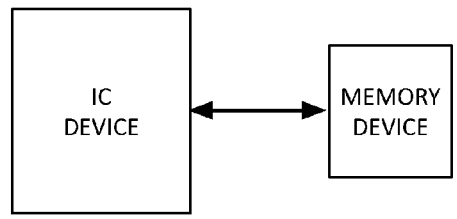
FIGS. 17A, 17B and 17C illustrate memory device integration into systems.
Figure 17B:
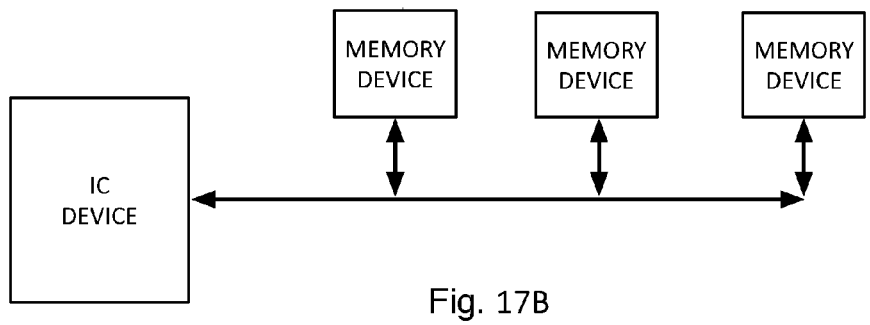
Figure 17C:
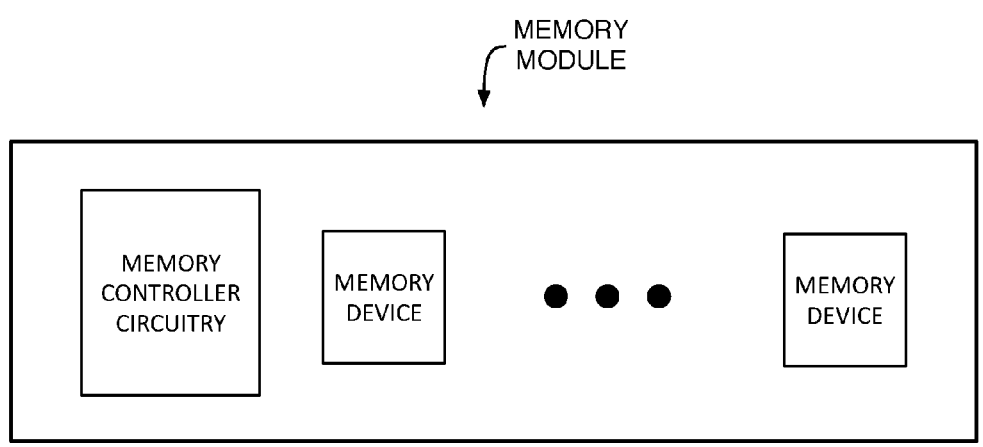

Further, as noted above, the dynamic random access memory may be implemented in a discrete type configuration/architecture (for example, a stand-alone memory device—see FIG. 16A) and/or embedded type configuration/architecture (for example, an integrated circuit device having logic circuitry and one or more dynamic random access memory cells and/or arrays incorporated therein or thereon—see FIG. 16B). Moreover, one or more aspects of the circuitry and techniques described herein (for example, the encoding and/or decoding circuitry and techniques) may be implemented in circuitry which is located "off-chip" relative to the discrete type and/or embedded type configuration/architectures. (See, for example, FIGS. 17A-17C). Physical configurations or architectures that implement the techniques described herein are intended to fall within the scope of the present invention.

Notably, the embodiments disclosed herein may exhibit one or more of the following attributes:

1. Longer refresh cycles relative to conventional DRAMs: lower dynamic energy.

2. Lower energy to write the cells relative to conventional DRAMs: lower static energy.

3. Higher density relative to conventional DRAMs.

4. Robustness to imperfections: it is not necessary to hit the exact values of the generator a. Moreover, imperfections of these values can be taken into account when designing the voltage PM code. This leads to a more robust operation.

Combination with an Outer ECC

Figure 15A:
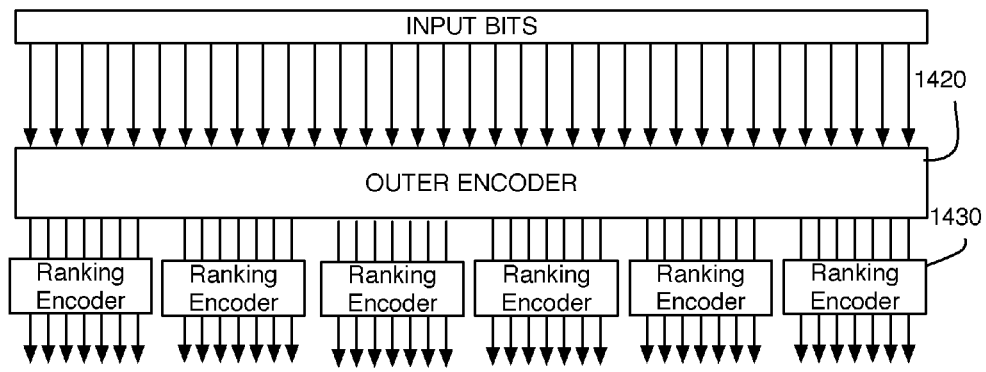
FIGS. 15A and 15B illustrate the use of an outer ECC in encoding and decoding.
Figure 15B:
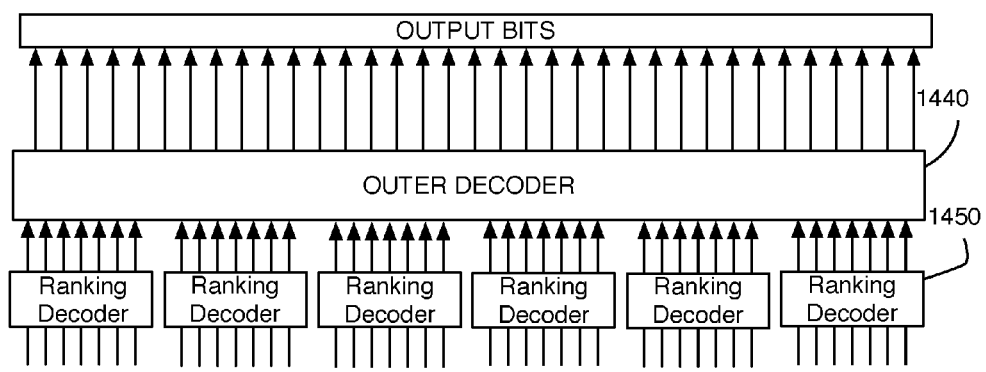

In one embodiment, the circuitry and techniques may be combined with an outer error-correcting code (ECC) to provide a higher reliability of the memory cells. An exemplary embodiment is described with reference to FIGS. 15A and 15B. Specifically, in FIG. 15A, write circuit 447 of FIG. 4B may comprise an Outer Encoder circuit 1420 whose task is to encode the input bits using an outer error-correcting code. The outer error-correcting code can be a binary code, or it can be a code defined over a larger alphabet, for example a Reed-Solomon code, or an algebraic geometry code, in order to provide better resilience to errors. Once the outer encoder circuit 1420 has encoded the bits, these bits are forwarded to the ranking encoder circuits 1430 for the computation of encoded information that will be eventually stored in the cells. Similarly, in FIG. 15B, ranking decoders 1450 decode the received information into bits, or sequences of bits, and these bits are forwarded to the outer decoder 1440 which calculate the output bits. The outer decoder may be part of the write/read circuit 447 of FIG. 4B in some embodiments.

An example of an outer ECC is now provided with reference to the code 8B6C above. The outer encoder may take some number L of bytes (wherein each byte comprises eight bits) and encode these L bytes using a Reed-Solomon code of length T over GF(256). These 8T bits are grouped into T groups of size 8, and each group is then fed to the rank encoder of the 8b6C code. The combined cell efficiency of this scheme is 4 L/3 T, and the outer coding can provide resilience to up to (T−L)/2 errors on groups of 6 cells.

The above description is exemplary and illustrative and is not meant to be restrictive. Many other methods and combinations of ECC schemes with encoders according to the various embodiments are possible and will become apparent to those of moderate skill in the art upon study of this disclosure. For example, the outer code may be a binary code with an efficient encoding and decoding procedure, such as an LDPC code. Or it may be a code derived from curves on a finite field (AG-code), or another type of code well suited for the application in memory storage. The application claims priority on all such schemes as well.

It should be noted that the term "circuit" may mean, among other things, a single component or a multiplicity of components, which are active and/or passive, and which are coupled together to provide or perform a desired function. The term "circuitry" may mean, among other things, a circuit, a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" may mean, among other things, a current or voltage signal(s) whether in an analog or a digital form, which may be a single bit (or the like) or multiple bits (or the like).

It should be further noted that the various circuits and circuitry disclosed herein may be described using computer aided design tools and expressed (or represented), as data and/or instructions embodied in various computer-readable media, for example, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). The embodiments described are also directed to such representation of the circuitry described herein (for example, storage data encoder circuitry and the storage data read/decoder circuitry), and/or techniques implemented thereby, and, as such, are intended to fall within the scope of the present inventions.

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits and circuitry, as well as techniques, disclosed herein may be represented via simulations and simulation instruction-based expressions using computer aided design, simulation and/or testing tools. The simulation of the circuitry described herein, including the storage data encoder circuitry and the storage data read/decoder circuitry and/or techniques implemented thereby, may be implemented by a computer system wherein characteristics and operations of such circuitry, and techniques implemented thereby, are simulated, imitated, replicated, analyzed and/or predicted via a computer system. Simulations and testing of the devices and/or circuitry described herein, and/or techniques implemented thereby, and, as such, are intended to fall within the scope of the present inventions. The computer-readable media and data corresponding to such simulations and/or testing tools are also intended to fall within the scope of the present inventions.

We claim:

1. An apparatus comprising:
    a memory area comprising a plurality of cell groups of k memory cells in each cell group, wherein k is an integer greater than one;
    a row and column decoder circuit coupled to the memory area and configured to select at least one cell group;
    a storage data encoder circuit configured to encode an n-bit value, for an n>k, received at a data input into a k-entry codeword of a voltage code, the k-entry codeword representing (i) a selection of a first permutation vector based on a first half of the n-bit value and a second permutation vector based on a second half of the n-bit value, wherein the first and second permutation vectors are weighted with first and second weights, respectively, and (ii) an element-by-element summation of the first and second permutation vectors, wherein each entry in the k-entry codeword is one of three possible entry values; and
    a cell-load unit configured to store the k-entry codeword as levels in the at least one selected cell group.

2. The apparatus of claim 1, wherein a summation of the k entries of each k-entry codeword in at least a subset of the set of possible k-entry codewords is equal to a predetermined constant over the subset.

3. The apparatus of claim 1, wherein the apparatus is a device selected from the group consisting of: an integrated circuit device, a discrete memory device, and a device having embedded memory.

4. The apparatus of claim 1, wherein the memory cells comprise circuit elements configured to store the k-entry codeword as a plurality of electrical quantities, the k-entry codeword selected from a set of at least $2^n$ distinct possible k-entry codewords.

5. The apparatus of claim 4, wherein the memory cells comprise a plurality of capacitors, and wherein the electrical quantities are charges stored on the plurality of capacitors.

6. The apparatus of claim 1, wherein the storage data encoder circuit is configured to form a first set of permutation selection quantities from the first half of the received n-bit value and a second set of permutation selection quantities from the second half of the received n-bit value.

7. The apparatus of claim 6, wherein the storage data encoder circuit comprises a logic circuit configured to implement Boolean algebra to form the first and second sets of permutation selection quantities.

8. The apparatus of claim 1, wherein the storage data encoder circuit processes the first half of the n-bit value and the second half of the n-bit value to identify indices of the first and second permutation vectors, respectively.

9. The apparatus of claim 1, wherein the storage data encoder circuit comprises a ranking encoder.

10. The apparatus of claim 1, further comprising a storage data decoder circuit configured to reconstruct an n-bit read value from a k-entry vector read from a selected read cell group by forming a k-length intermediate vector comprising information about relative magnitudes of the elements of the read k-entry vector, the k-length intermediate vector determining a second half of the n-bit read value, forming a k-length difference vector by subtracting a weighted version of the k-length intermediate vector from the read k-entry vector, the k-length difference vector determining a first half of the n-bit read value, the storage data decoder circuit configured to output the reconstructed n-bit read value.

11. An apparatus comprising:
a memory area comprising a plurality of cell groups of k memory cells in each cell group, wherein k is an integer greater than one;
a row and column decoder circuit coupled to the memory area and configured to select a cell group;
a charge-read unit configured to read a k-entry vector as charge levels from the k-memory cells of the selected cell group; and
a storage data decoder circuit configured to reconstruct an n-bit read value from the k-entry vector read from the selected cell group, for an n>k, by forming a k-length intermediate vector comprising information about relative magnitudes of the elements of the read k-entry vector, the k-length intermediate vector determining a second half of the n-bit read value, forming a k-length difference vector by subtracting a weighted version of the k-length intermediate vector from the read k-entry vector, the k-length difference vector determining a first half of the n-bit read value, the storage data decoder circuit configured to output the reconstructed n-bit read value.

12. The apparatus of claim 11, wherein the storage data decoder circuit is a ranking decoder.

13. The apparatus of claim 12, wherein the k-length intermediate vector comprises (i) a logic 1 in positions corresponding to positions of the read k-entry vector having largest relative magnitudes and (ii) logic zeroes in other positions.

14. The apparatus of claim 13, wherein the storage data decoder circuit comprises a logic circuit configured to implement Boolean algebra on the k-length intermediate vector to determine the second half of the n-bit read value.

15. The apparatus of claim 12, wherein the k-length intermediate vector comprises (i) respective ordered magnitude indicators in positions corresponding to positions of the read k-entry vector having largest relative magnitudes and (ii) logic zeroes in other positions.

16. The apparatus of claim 11, wherein the storage data decoder circuit further comprises a logic circuit configured to form quantities by implementing Boolean algebra on the k-length intermediate vector, and to use the quantities to determine the second half of the n-bit read value.

17. The apparatus of claim 11, wherein the storage data decoder circuit further comprises a logic circuit configured to form quantities by implementing Boolean algebra on the k-length intermediate vector, and to use the quantities to determine the first half of the n-bit read value.

18. The apparatus of claim 11, wherein the weighted version of the k-length intermediate vector comprises weights based on at least one system parameter selected from the group consisting of a refreshed interval parameter, a decay time constant parameter, and a process variation parameter.

19. The apparatus of claim 11, further comprising:
a storage data encoder circuit configured to encode an n-bit write value received at a data input into a k-entry codeword of a voltage code, the k-entry codeword representing (i) a selection of a first permutation vector based on a first half of the n-bit write value and a second permutation vector based on a second half of the n-bit write value, wherein the first and second permutation vectors are weighted with first and second weights, respectively, and (ii) an element-by-element summation of the first and second permutation vectors, wherein each entry in the k-entry codeword is one of three possible entry values; and
a cell-load unit configured to store the k-entry codeword as levels in at least one selected write cell group of the memory area.

20. The apparatus of claim 19, wherein the storage data encoder circuit comprises a ranking encoder.

* * * * *